(12) United States Patent
Nagai

(10) Patent No.: US 7,755,095 B2
(45) Date of Patent: Jul. 13, 2010

(54) SEMICONDUCTOR LIGHT EMITTING DEVICE, LIGHTING MODULE, LIGHTING APPARATUS, DISPLAY ELEMENT, AND MANUFACTURING METHOD FOR SEMICONDUCTOR LIGHT EMITTING DEVICE

(75) Inventor: Hideo Nagai, Osaka (JP)

(73) Assignee: Panasonic Corporation, Osaka (JP)

( * ) Notice: Subject to any disclaimer, the term of this patent is extended or adjusted under 35 U.S.C. 154(b) by 491 days.

(21) Appl. No.: 10/580,929

(22) PCT Filed: Dec. 17, 2004

(86) PCT No.: PCT/JP2004/019457
§ 371 (c)(1),
(2), (4) Date: May 30, 2006

(87) PCT Pub. No.: WO2005/062389
PCT Pub. Date: Jul. 7, 2005

(65) Prior Publication Data
US 2007/0102693 A1    May 10, 2007

(30) Foreign Application Priority Data
Dec. 24, 2003  (JP)  ............................. 2003-428258

(51) Int. Cl.
*H01L 29/18* (2006.01)
*H01L 29/74* (2006.01)
*A01K 7/00* (2006.01)

(52) U.S. Cl. ........................... 257/88; 257/91; 257/98; 257/99; 313/485; 313/511

(58) Field of Classification Search .................... 257/88, 257/91, 98, 99, 100, 787, E23.066; 313/485, 313/511
See application file for complete search history.

(56) References Cited

U.S. PATENT DOCUMENTS

| 6,373,188 | B1 * | 4/2002 | Johnson et al. ............. 313/506 |
| 2002/0139987 | A1 * | 10/2002 | Collins et al. ................ 257/88 |
| 2003/0160256 | A1 * | 8/2003 | Durocher et al. ............. 257/88 |

FOREIGN PATENT DOCUMENTS

| JP | 10-065221 | 3/1998 |
| JP | 11-150303 | 6/1999 |
| JP | 2001-15817 | 1/2001 |
| JP | 2002-324915 | 11/2002 |
| WO | 2005-022654 A2 | 3/2005 |

* cited by examiner

*Primary Examiner*—Howard Weiss
*Assistant Examiner*—Steven H Rao

(57) ABSTRACT

In an LED array chip (2), LEDs (6) are connected together in series by a bridging wire (30) The LEDs (6) each have a semiconductor multilayer structure (8-18) including a light emitting layer (14) Here, the semiconductor multilayer structure (8-18) is epitaxially grown on a front surface of an SiC substrate (4) A phosphor film (48) covers the LEDs (6) Two power supply terminals (36 and 38), which are electrically independent from each other, are formed on a back surface of the SiC substrate (4) The power supply terminal (36) is connected to a cathode electrode (32) of an LED (6a) at a lower potential end by a bridging wire (40) and a plated-through hole (42) The power supply terminal (38) is connected to an anode electrode (34) of an LED (6d) at a higher potential end by a bridging wire (44) and a plated-through hole (46).

33 Claims, 29 Drawing Sheets

STEP A1

STEP B1

STEP C1

STEP D1

STEP E1

STEP F1

STEP G1

STEP H1

STEP I1

STEP J1

STEP K1

STEP L1

STEP M1

STEP A2

STEP B2

STEP C2

STEP D2

STEP E2

STEP F2

STEP G2

STEP H2

STEP I2

STEP J2

STEP K2

STEP L2

STEP M2

STEP N2

STEP O2

STEP P2

STEP Q2

4050
4052

4050

4054

PORTION D

SEMICONDUCTOR LIGHT EMITTING DEVICE, LIGHTING MODULE, LIGHTING APPARATUS, DISPLAY ELEMENT, AND MANUFACTURING METHOD FOR SEMICONDUCTOR LIGHT EMITTING DEVICE

TECHNICAL FIELD

The present invention relates to a semiconductor light emitting device such as a light emitting diode (LED) chip, a manufacturing method for the semiconductor light emitting device, and a lighting module, a lighting apparatus, and a display element using the semiconductor light emitting device. The present invention especially relates to a semiconductor light emitting device which includes a phosphor to produce visible light of a desired color.

BACKGROUND ART

In the field of LEDs, vigorous researches are recently conducted to use white LEDs for lighting, in accordance with development of white LEDs with higher luminance. Having a feature of a point light source, LEDs are expected to replace halogen lamps and the like which have been conventionally used as spotlighting in a shop, a museum, a showroom, and the like.

At present, a mainstream white LED includes a combination of an LED bare chip emitting blue light and a phosphor that is excited by the blue light to emit yellow light. The blue light and the yellow light mix together, to produce white light. Generally, to form this white LED, the bare chip is first mounted on a lead frame, printed wiring board, or the like. After this, a resin containing particles of a phosphor is dropped onto the bare chip, which forms the phosphor on and around the bare chip (see Japanese patent No. 2998696).

Here, although such a current white LED has higher luminance than previous ones, a single LED bare chip can only produce a small amount of light. Therefore, multiple LED bare chips are mounted on a printed wiring board, so as to produce a sufficient amount of light for a lighting apparatus. Furthermore, to make effective use of light emitted by each LED bare chip, a printed wiring board to which a reflective board is attached (hereinafter referred to as a printed wiring board with a reflective board), or a printed wiring board which includes a reflective film formed in an insulating layer (hereinafter referred to as a printed wiring board with a reflective film) is used as a mounting substrate.

The reflective board is an aluminum board or the like in which a taper hole is provided in correspondence with a location, on the printed wiring board, at which each LED bare chip is to be mounted. The reflective board is adhered to the printed wiring board using an adhesive agent. On the other hand, the printed wiring board with a reflective film is composed of two insulating layers, for example. In the upper insulating layer, a taper hole is provided, and an aluminum reflective film is formed on a wall of the taper hole. In this case, each LED bare chip is mounted in a location, on the lower insulating layer, which corresponds to a center of the taper hole. The taper hole provided in the reflective board and the taper hole with the aluminum reflective film on its wall provided in the upper insulating layer are hereinafter collectively referred to as a reflective hole.

If an LED bare chip is mounted on either of the two different printed wiring boards described above, light emitted from a side surface of the LED bare chip is reflected forward by the wall of the reflective hole. Thus, the light from the side surface is emitted in the same direction as light from a front surface of the LED bare chip. Thus, light emitted from the LED bare chip can be efficiently used. Here, it is desirable to make a distance between the LED bare chip and the wall of the reflective hole as small as possible, in order to minimize a size of a lighting apparatus and the like and maximize a light collection efficiency. In other words, it is preferable to make a diameter of the reflective hole as small as possible.

Here, when a resin containing particles of a phosphor is dropped onto the LED bare chip, which has been mounted on one of the above printed wiring boards, in a mounting process of a white LED, the resin fills the reflective hole. Which is to say, a phosphor is formed so as to be in contact with the wall of the reflective hole. This means that the wall of the reflective hole does not appropriately reflect light emitted from a side surface of the LED bare chip forward. Accordingly, a desired light collection efficiency can not be achieved.

The U.S. Pat. No. 6,650,044 discloses a technique to cover a bare chip with a phosphor in a different method from a method in which a resin containing particles of a phosphor is dropped onto a bare chip. This technique is described in the following with reference to FIGS. 1 and 2.

As shown in FIG. 1, a plurality of bare chips 900 (for example, six bare chips 900A to 900F) are flip-chip mounted on a printed wiring board 902. After this, a stencil 904 is overlaid on the printed wiring board 902 in the following manner. Here, the stencil 904 is a stainless-steel plate which has a slightly larger thickness than the bare chips 900. In the stencil 904, through holes 906A to 906F that are slightly larger than the bare chips 900 in size are provided so as to correspond to the bare chips 900. The stencil 904 is aligned with the printed wiring board 902 so that the bare chips 900A to 900F are respectively to be fitted into the through holes 906A to 906F, and then overlaid.

FIG. 2A illustrates a cross-section of the printed wiring board 902 on which the stencil 904 is overlaid. After this, the through holes 906 are filled with a material 908 containing particles of a phosphor (shown in FIG. 2B). Subsequently, the stencil 904 is taken away (shown in FIG. 2C), and the material 908 is then cured. In this way, a white LED including a phosphor (908) can be mounted on the printed wiring board 902. Furthermore, the phosphor (908) is deposited on and around each of the bare chips 900 at a substantially even thickness.

This technique is applicable to mount a white LED on a printed wiring board with a reflective board in such a manner that a white LED is first mounted on the printed wiring board, and a reflective board is then adhered to the printed wiring board. However, the technique is difficult to be used for mounting a white LED on a printed wiring board with a reflective film.

Here, a printed wiring board with a reflective board is not as preferable as a printed wiring board with a reflective film for the following reasons. Firstly, it is difficult to form an adhesive layer adhering a reflective board to a printed wiring board, at an even thickness. Therefore, a relative location of each reflective hole provided in the reflective board with respect to a corresponding white LED in a direction of light emission is not uniform. Accordingly, a light collection efficiency of each reflective hole is not uniform. Secondly, a predetermined relative location between a reflective hole and a bare chip (a white LED chip) is not likely to be achieved. This is because a bare chip is not precisely mounted on a designed location on a printed wiring board, and a reflective board can not be perfectly aligned with the printed wiring board. This degrades a light collection efficiency. Thirdly, when a printed wiring board with a reflective board is utilized, an additional step is required for adhering the reflective board which has been separately manufactured to the printed wiring board. These problems are not created if a printed wiring board with a reflective film, which has a reflective hole formed as part of the printed wiring board, is utilized.

Accordingly, a printed wiring board with a reflective film is more suitable than a printed wiring board with a reflective board, as a constituent of a lighting module or the like including a white LED.

It should be noted that the above-mentioned problems are not particular to a white LED, but common to any semiconductor light emitting devices which include a combination of an LED bare chip and a phosphor to produce light of a desired color.

In light of the above-described problems, an object of the present invention is to provide a semiconductor light emitting device that can be mounted on a printed wiring board with a reflective film in such a manner that a phosphor of the light emitting device is not in contact with a wall of a reflective hole in the printed wiring board, a manufacturing method for the same, and a lighting module, a lighting apparatus and a display element including the semiconductor light emitting device.

DISCLOSURE OF THE INVENTION

The object can be achieved by a semiconductor light emitting device comprising: a substrate; a semiconductor multilayer structure formed on a first main surface of the substrate, the semiconductor multilayer structure including a light emitting layer; a first electrode and a second electrode formed on the semiconductor multilayer structure, power being supplied to the semiconductor multilayer structure through the first electrode and the second electrode so as to cause the light emitting layer to emit light; a phosphor film covering at least a main surface of the semiconductor multilayer structure which faces away from the first main surface of the substrate; a first terminal and a second terminal formed on a second main surface of the substrate; a first conductive member electrically connecting the first electrode to the first terminal; and a second conductive member electrically connecting the second electrode to the second terminal.

According to this construction, the semiconductor light emitting device includes the phosphor film covering the surface of the semiconductor multilayer structure which faces away from the first main surface of the substrate, and the first and second power supply terminals on the second main surface of the substrate. Therefore, the semiconductor light emitting device can be directly mounted on a bottom of a reflective hole provided in a mounting substrate. Furthermore, the phosphor film is not in contact with a wall or the like of the reflective hole.

The object can be also achieved by a lighting module or a lighting apparatus which includes the above-described semiconductor light emitting device on a mounting substrate. Here, a printed wiring board with a reflective film can be used as the mounting substrate. Therefore, light emitted from the semiconductor light emitting device can be efficiently collected to be irradiated toward an object.

The object can be also achieved by a manufacturing method for the semiconductor light emitting device, which achieves the above-described effects.

BEST MODE FOR CARRYING OUT THE INVENTION

The following describes embodiments of the present invention with reference to the attached figures.

First Embodiment

Figure 1:
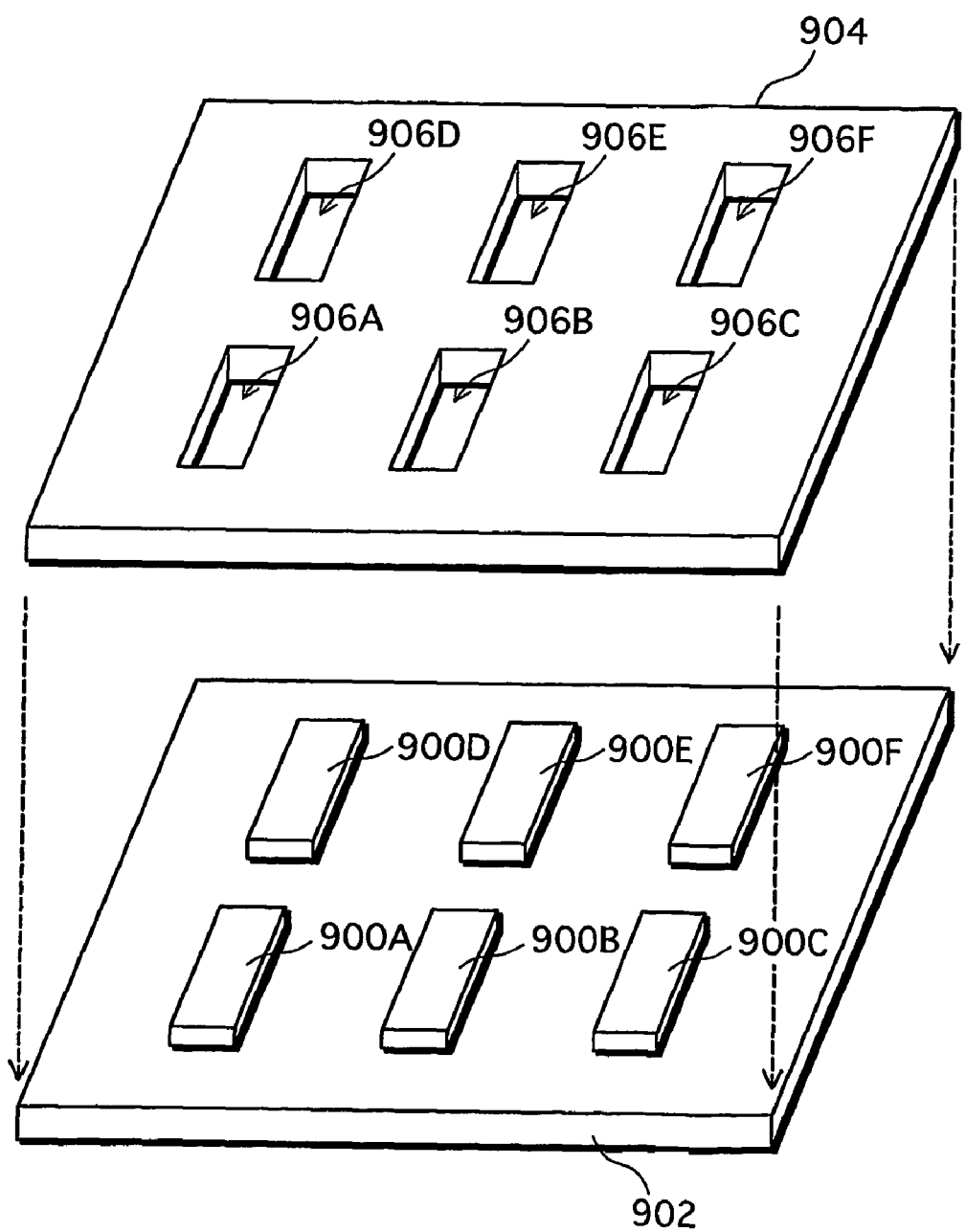
FIG. 1 illustrates a prior art.
Figure 2A:
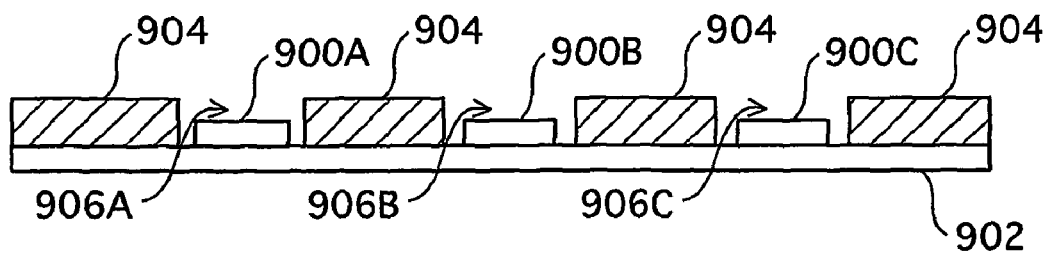
FIG. 2 illustrates the prior art.
Figure 2B:
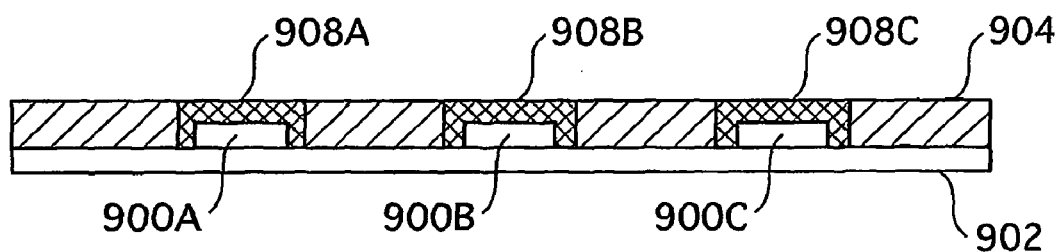
Figure 2C:
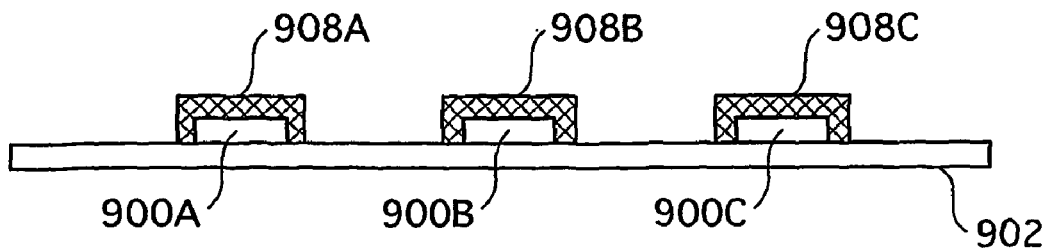
Figure 3A:
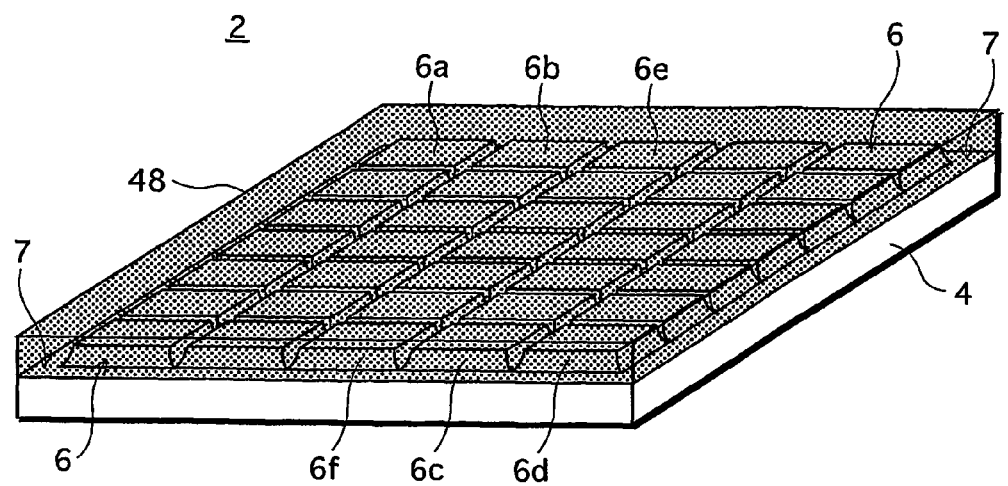
FIG. 3A is a perspective view illustrating an LED array chip relating to a first embodiment.
Figure 3B:
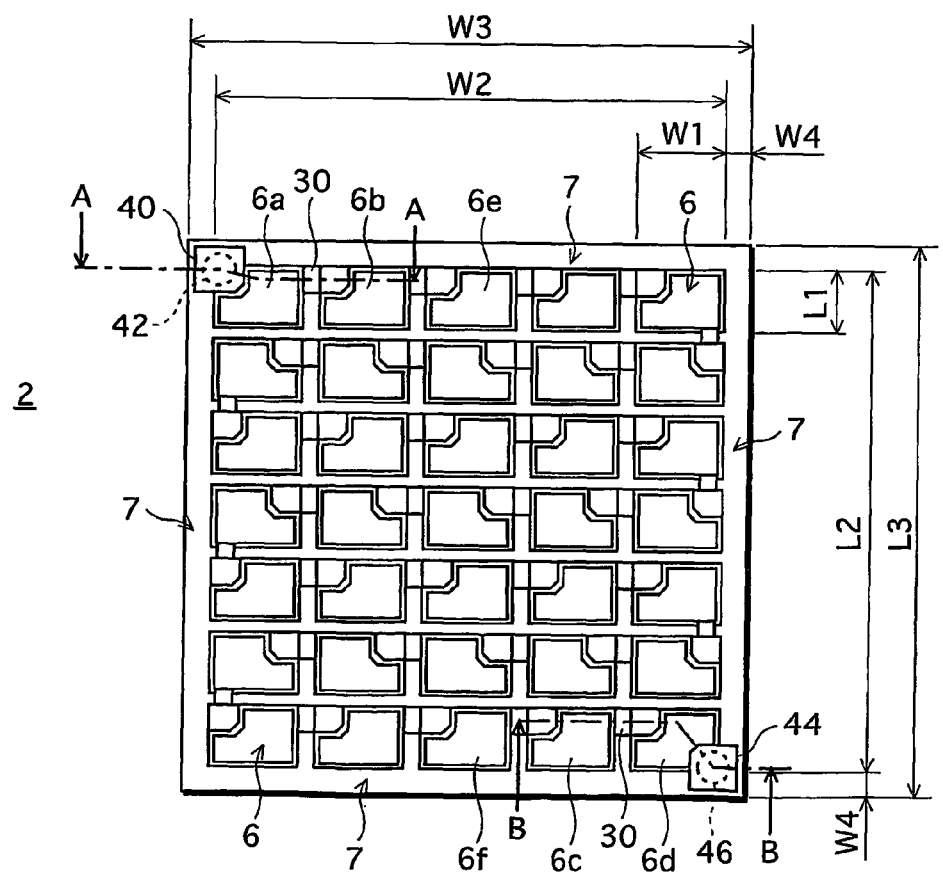
FIG. 3B is a plan view illustrating the LED array chip relating to the first embodiment.

FIG. 3A is an external perspective view illustrating a construction of a white LED array chip 2 which is one type of a semiconductor light emitting device (hereinafter simply referred to as an LED array chip 2). FIG. 3B is a plan view illustrating the LED array chip 2. FIG. 3A is mainly intended to show how LEDs 6 (described later) are arranged, and therefore does not show minute depressions and protrusions on surfaces of the LEDs 6. FIG. 3B does not show a phosphor film 48 (described later). It should be noted that a reduced scale for each constituent is not uniform in any of the drawings including FIGS. 3A and 3B.

As shown in FIGS. 3A and 3B, the LED array chip 2 is formed in such a manner that the LEDs 6 are arranged in a matrix of N rows and M columns (in the first embodiment, a matrix of seven rows and five columns, in total 35 LEDs 6) on a non-doped (highly resistant) SiC substrate 4 which is a semiconductor substrate (hereinafter simply referred to as an SiC substrate 4). Each of the LEDs 6 is a light emitting element including a semiconductor multilayer structure including a light emitting layer. Here, the LEDs 6 are formed on a main surface of the SiC substrate 4 by epitaxial growth, with maintaining a peripheral portion having a width W4 of 50 μm along edges of the main surface. The peripheral portion is a part of the main surface of the SiC substrate 4 in which the semiconductor multilayer structures (the 35 LEDs 6) are not formed, and is hereinafter referred to as an exposed portion 7. In other words, the exposed portion 7 is formed so as to surround the semiconductor multilayer structures.

A size L1×W1 of each LED 6 is 285 μm×400 μm. A size L2×W2 of an area in which the LEDs 6 are formed is 2 mm×2 mm. A size L3×W3 of the LED array chip 2 is 2.1 mm×2.1 mm.

The following describes a construction of the LED array chip 2 in more detail with reference to cross-sectional views.

Figure 4A:
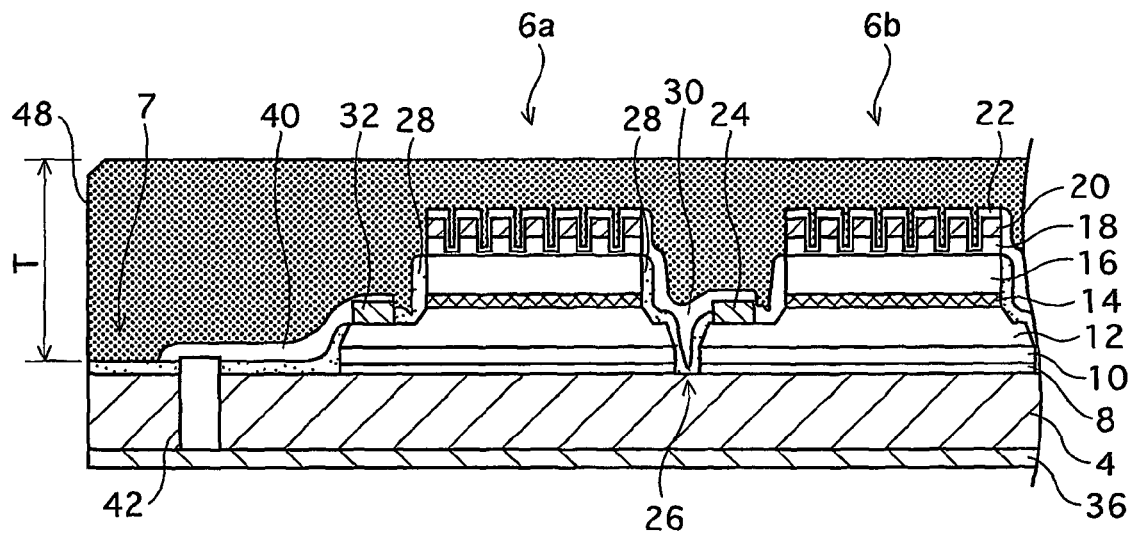
FIG. 4 includes cross-sectional views each illustrating part of the LED array chip relating to the first embodiment.
Figure 4B:
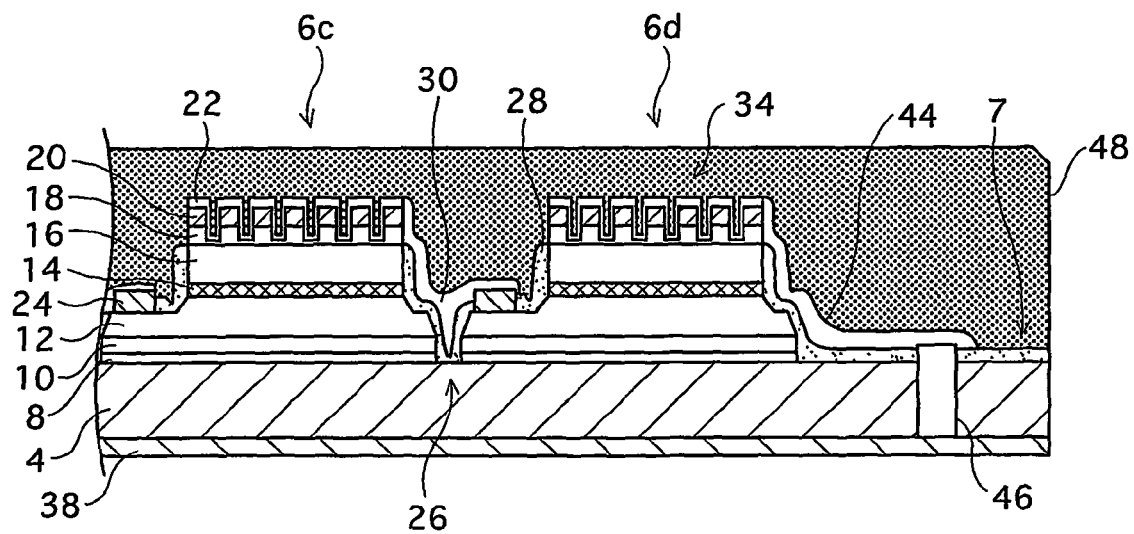

FIG. 4A illustrates a cross-section along a line AA shown in FIG. 3B, and FIG. 4B illustrates a cross-section along a line BB shown in FIG. 3B. To be specific, FIG. 4A shows an LED 6a of the first row and the first column and an LED 6b of the first row and the second column, and FIG. 4B shows an LED 6c of the seventh row and the fourth column and an LED 6d of the seventh row and the fifth column.

Each of the LEDs 6 is formed by a semiconductor multilayer structure including an n-AlGaN buffer layer 8 (having a thickness of 30 nm), a distributed bragg reflector (DBR) layer 10 (having a thickness of 3 μm) composed of 30 periods of n-AlGaN/GaN, an n-GaN clad layer 12 (having an Si-doping amount of $3 \times 10^{18}$ cm$^{-3}$ and a thickness of 200 nm), an InGaN/GaN multiple quantum well (MQW) light emitting layer 14 composed of six periods of InGaN (having a thickness of 2 nm)/GaN (having a thickness of 8 nm), a p-GaN clad layer 16 (having an Mg-doping amount of $1 \times 10^{19}$ cm$^{-3}$ and a thickness of 200 nm), and a p-GaN contact layer 18 (having an Mg-doping amount of $3 \times 10^{19}$ cm$^{-3}$ and a thickness of 200 nm). These layers 8, 10, 12, 14, 16 and 18 are formed on the SiC substrate 4 in the stated order. In other words, the LED 6 has a basic construction in which a light emitting layer (the MQW light emitting layer 14) is sandwiched between a conductive layer closer to the SiC substrate 4 (the n-GaN clad layer 12) and a conductive layer closer to a light extraction surface (the p-GaN contact layer 18 and the p-GaN clad layer 16).

An ITO transparent electrode 22 is formed on the p-GaN contact layer 18, with an Ni/Au thin film 20 therebetween. A Ti/Au electrode 24, which is an n-electrode (a cathode electrode), is formed on the n-GaN clad layer 12.

When this LED 6 is supplied with power through the ITO transparent electrode 22 and the Ti/Au electrode 24, the light emitting layer 14 emits blue light having a wavelength of 460 nm. In the first embodiment, a p-electrode (an anode electrode) for the LED 6 is formed by the Ni/Au thin film 20 and the ITO transparent electrode 22, so as to improve transmission of the light emitted from the light emitting layer 14.

Figure 5A:
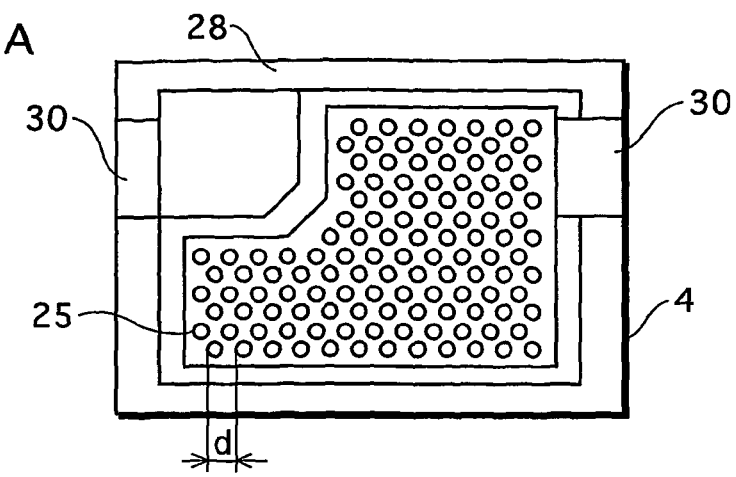
FIG. 5A is a plan view illustrating an LED included in the LED array chip relating to the first embodiment.

A main surface of the p-electrode, which is the light extraction surface, is made regularly uneven to enhance a light extraction efficiency. FIG. 5A is a plan view illustrating the LED 6. As shown in FIG. 5A, circular depressions 25 are formed with a pitch (d) of 1 μm in the first embodiment, to make the main surface of the p-electrode uneven. Here, the depressions 25 may have a quadrangular or hexagonal shape when seen from above, instead of circular. Furthermore, the main surface of the p-electrode may be made uneven in such a manner that linear grooves are formed in a predetermined pitch. Also, the main surface may be made uneven by roughening the surface irregularly.

The 35 LEDs 6 having the above-described construction are connected in series on the SiC substrate 4.

FIGS. 4A and 4B are used to explain how the LEDs 6 are connected together.

As shown in FIG. 4A, the adjacent LEDs 6a and 6b are separated from each other by a division groove 26 that is deep enough to reach the SiC substrate 4. The same applies to each pair of adjacent LEDs 6, including a pair of the LEDs 6c and 6d.

Figure 5B:
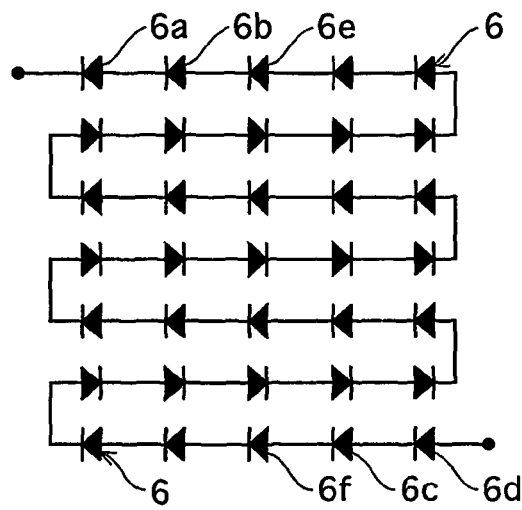
FIG. 5B illustrates how LEDs are connected in the LED array chip relating to the first embodiment.

An insulating film 28 (Si$_3$N$_4$ film) is formed so as to cover side surfaces of each LED 6 and the division groove 26. A bridging wire 30 is formed on the insulating film 28, to connect a p-electrode (an Ni/Au thin film 20 and an ITO transparent electrode 22) of the LED 6a and an n-electrode (a Ti/Au electrode 24) of the LED 6b. Similarly, a bridging wire 30 connects a p-electrode of the LED 6c to an n-electrode of the LED 6d. In the same manner, LEDs from an LED 6e of the first row and the third column to an LED 6f of the seventh row and the third column are connected together by a bridging wire 30. Thus, all of the 35 LEDs 6 are connected in series as shown in FIG. 5B. A Ti/Au electrode 24 of the LED 6a at a lower potential end is constituted as a cathode electrode 32 of the LED array chip 2, and an Ni/Au thin film 20 and an ITO transparent electrode 22 of the LED 6d at a higher potential end are constituted as an anode electrode 34 of the LED array chip 2.

Figure 5C:
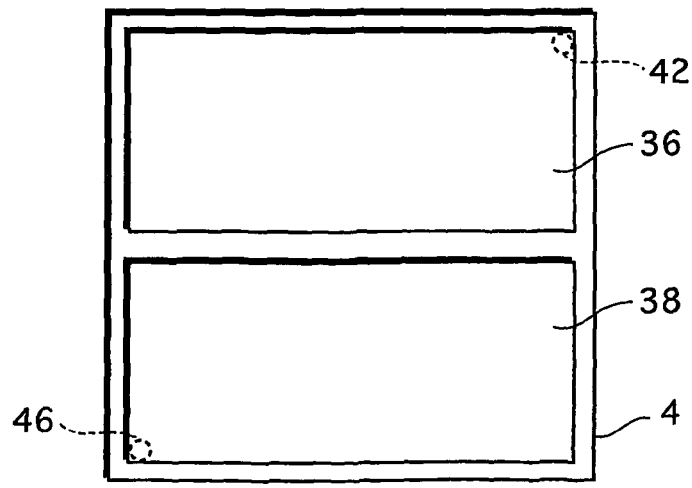
FIG. 5C is a bottom plan view illustrating the LED array chip relating to the first embodiment.

FIG. 5C illustrates a back surface of the LED array chip 2. As shown in FIG. 5C, two power supply terminals 36 and 38 are formed on a back surface of the SiC substrate 4 which faces away from the LEDs 6. The power supply terminals 36 and 38 are each formed by a Ti/Pt/Au film.

As shown in FIG. 4A, the cathode electrode 32 of the LED array chip 2 is connected to the power supply terminal 36 by a bridging wire 40 and a plated-through hole 42 provided in the SiC substrate 4. Also, as shown in FIG. 4B, the anode electrode 34 of the LED array chip 2 is connected to the power supply terminal 38 by a bridging wire 44 and a plated-through hole 46 provided in the Sic substrate 4. The plated-through holes 42 and 46 are each formed by filling an opening having a diameter of 30 μm provided in the SiC substrate 4, with platinum (Pt). When an electric current of 50 mA is applied to the 35 LEDs 6 through the power supply terminals 36 and 38 with heat dissipation being ensured, an operation voltage of 120 V is observed.

The phosphor film 48 is formed so as to cover the LEDs 6 and the entire exposed portion 7. The phosphor film 48 is made of a light-transmitting resin such as silicone in which particles of a yellow phosphor $(Sr, Ba)_2SiO_4:Eu^{2+}$ and ultrafine particles of $SiO_2$ are dispersed. The phosphor film 48 has a thickness T (shown in FIG. 4A) of 50 μm. The light-transmitting resin may be an epoxy resin or a polyimide resin, other than silicone.

The phosphor in the phosphor film 48 converts part of the blue light emitted from the light emitting layer 14 of the LED 6 into yellow light. The blue light emitted from the LED 6 and the yellow light from the phosphor film 48 mix together, to produce white light. Here, the DBR layer 10, which is a light reflective layer, is formed between the light emitting layer 14 and the SiC substrate 4. Thus, more than 99% of blue light emitted from the light emitting layer 14 towards the SiC substrate 4 is reflected back towards the light extraction surface. This improves a light extraction efficiency of the LED 6. In this description, blue light indicates light having a wavelength of no less than 400 nm and less than 500 nm, and yellow light indicates light having a wavelength of no less than 550 nm and less than 600 nm. Here, the blue light emitted from the LED 6 has a peak emission wavelength of 460 nm according to the above description. However, the LED 6 may be configured to emit blue light having a different peak emission wavelength within the above-mentioned range.

The following describes a manufacturing method for this LED array chip 2, with reference to FIGS. 6 to 9.

In FIGS. 6 to 9, a material to form each constituent of the LED array chip 2 is identified by a three-digit number whose first digit is one. The last two digits of the three-digit number represent a reference numeral identifying the corresponding constituent of the LED array chip 2.

Figure 6:
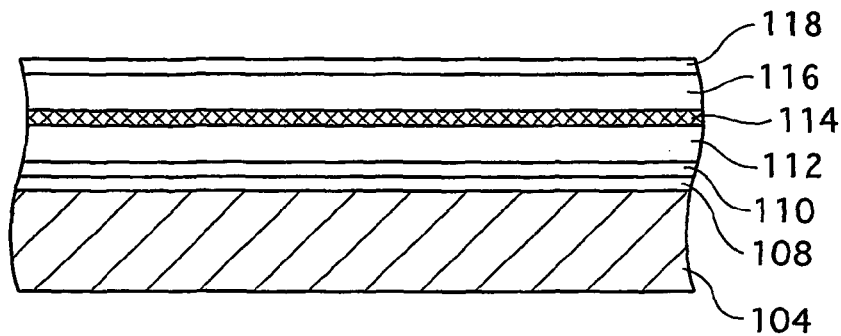
FIG. 6 is used to illustrate a manufacturing method for the LED array chip relating to the first embodiment.
Figure 6:
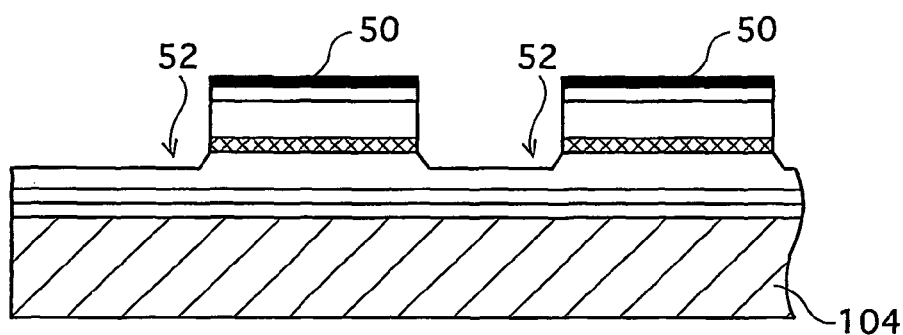
Figure 6:
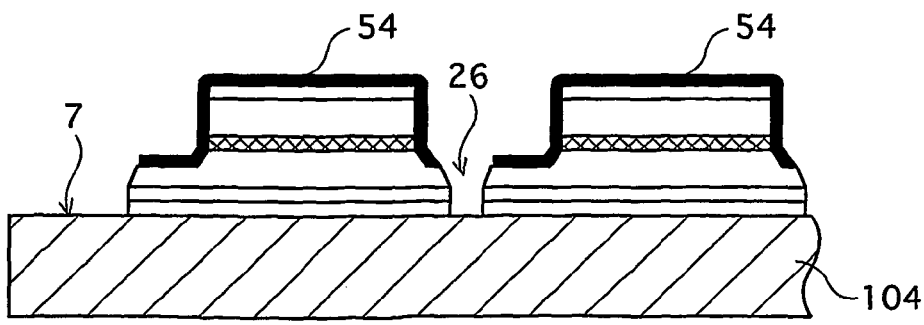
Figure 7:
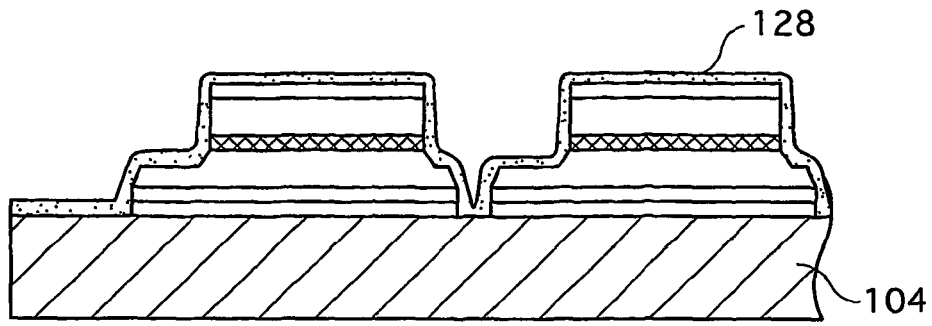
FIG. 7 is used to illustrate the manufacturing method for the LED array chip relating to the first embodiment.
Figure 7:
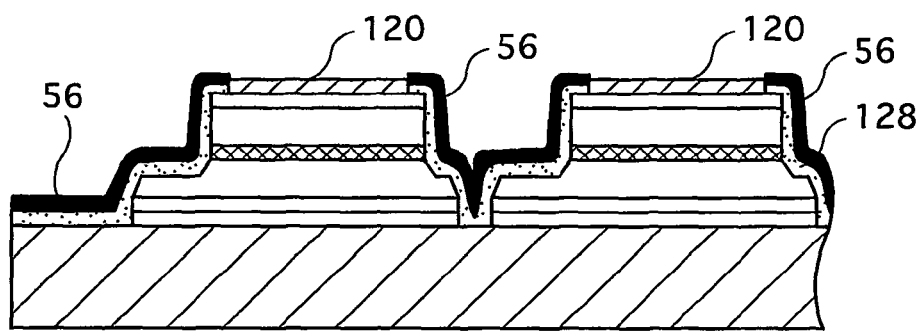
Figure 7:
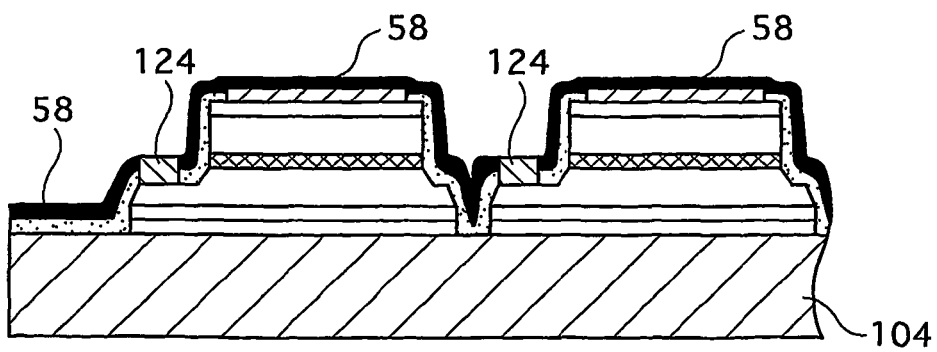
Figure 8:
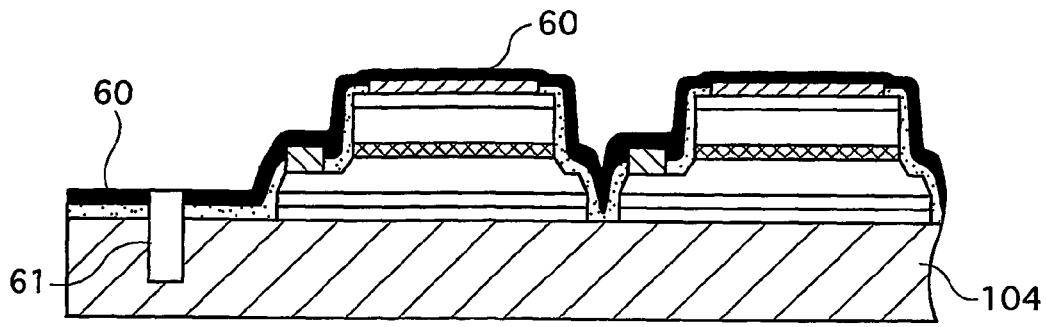
FIG. 8 is used to illustrate the manufacturing method for the LED array chip relating to the first embodiment.
Figure 8:
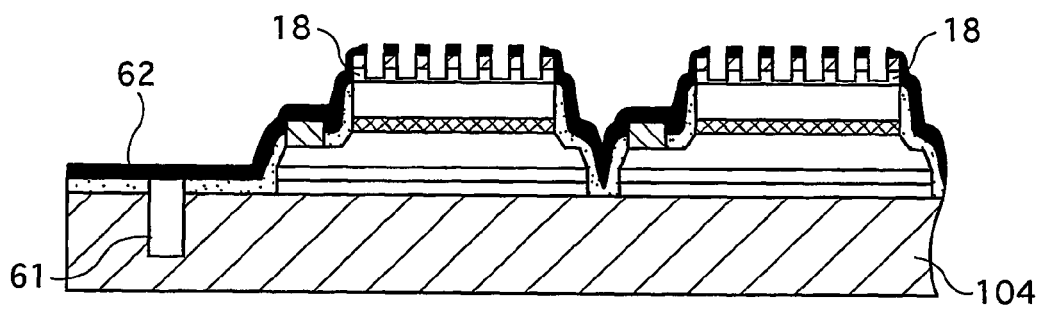
Figure 8:
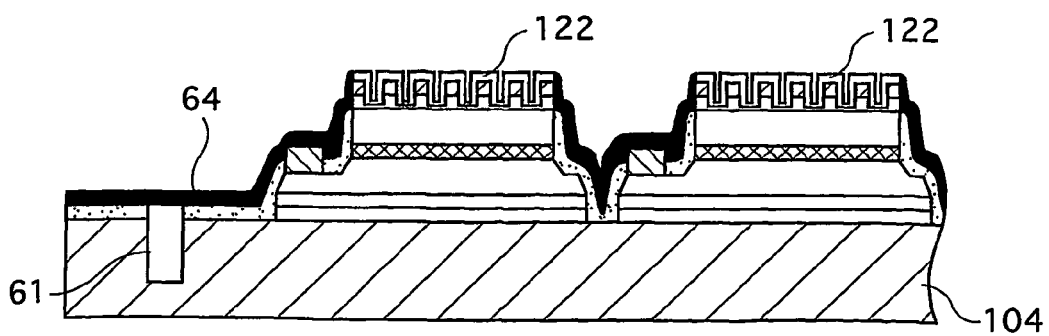
Figure 9:
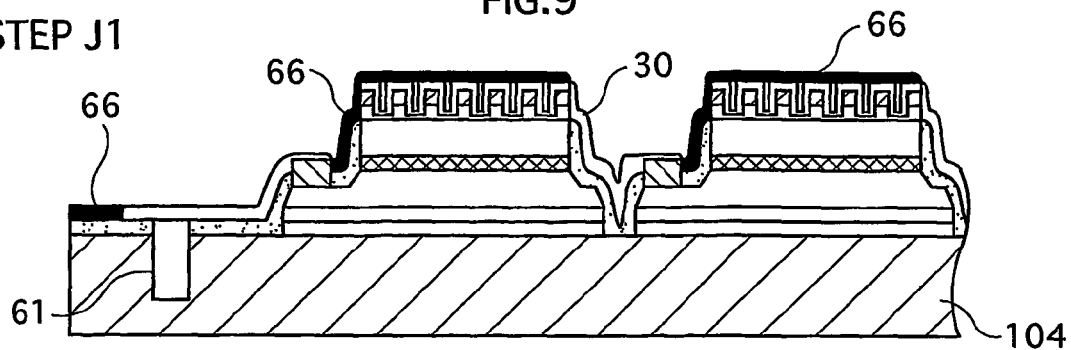
FIG. 9 is used to illustrate the manufacturing method for the LED array chip relating to the first embodiment.
Figure 9:
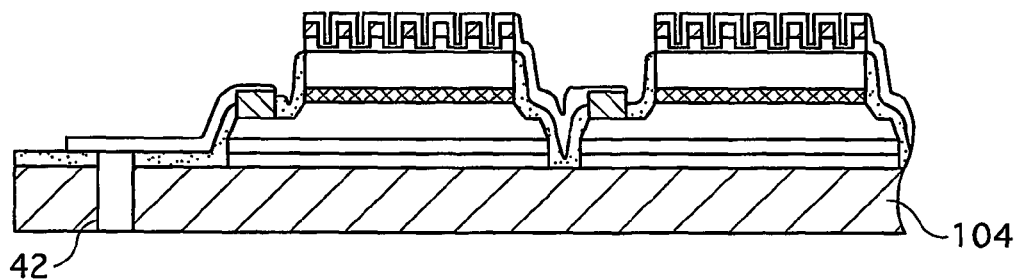
Figure 9:
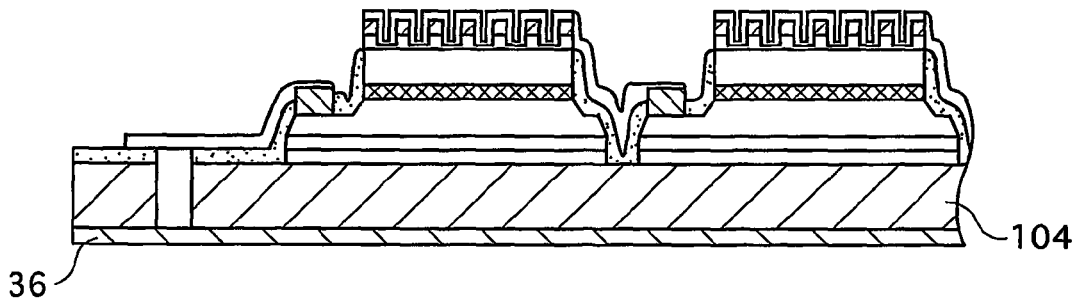
Figure 9:
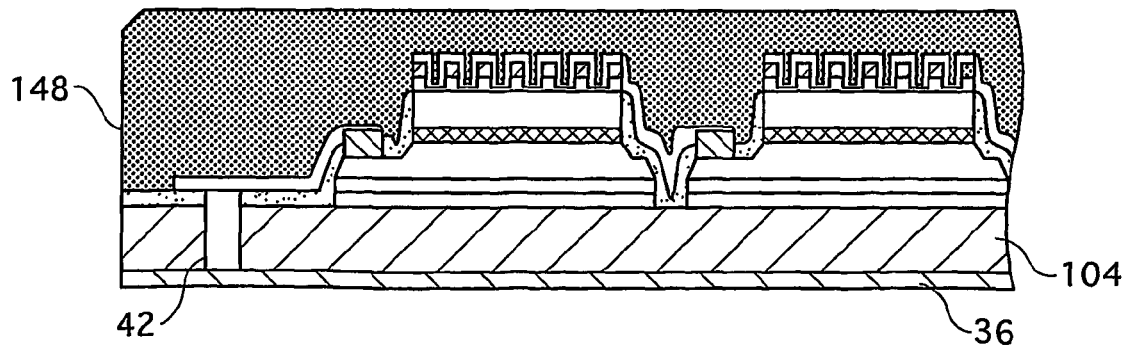

Firstly, as shown in FIG. 6, an n-AlGaN buffer layer 108, a DBR layer 110 composed of 30 periods of n-AlGaN/GaN, an n-GaN clad layer 112, an InGaN/GaN MQW light emitting layer 114, a p-GaN clad layer 116 and a p-GaN contact layer 118 are formed on a non-doped SiC substrate 104 in the stated order using a metal organic chemical vapor deposition (MOCVD) method (step A1). Here, the non-doped SiC substrate 104 has a diameter of two inches and a thickness of 300 μm.

After this, a mask 50 is formed on a lamination made up of the layers 118, 116, 114, 112, 110 and 108, so as to mask an area that is slightly larger than an area in which the Ni/Au thin film 20 (and the ITO transparent electrode 22) of each LED 6 is to be formed. An unmasked area of the lamination is removed by etching to a depth of approximately half of the thickness of the n-GaN clad layer 112 (step B1). Thus, a surface 52 to connect the Ti/Au electrode 24 (an n-electrode formation surface) is formed. The mask 50 is removed prior to the next step.

Subsequently, a mask 54 is formed on the resulting surface after the step B1 except for areas in which the exposed portion 7 and the division groove 26 are to be formed. Unmasked areas of a lamination made up of the remaining layer 112 and the layers 110 and 108 are removed by etching to such a depth that the SiC substrate 104 is exposed, to create the exposed portion 7 and the division groove 26 (step C1). Which is to say, the exposed portion 7 is created by removing a corresponding part of the semiconductor multilayer structure composed of the layers 108 to 118. After the etching is completed, the mask 54 is removed prior to the next step.

An $Si_3N_4$ film 128, which is an insulating film, is formed by sputtering or the like for insulation and surface protection (step D1).

A mask 56 is then formed so as to mask the $Si_3N_4$ film 128 except for an area in which the Ni/Au thin film 20 (and the ITO transparent electrode 22) of each LED 6 is to be formed. An unmasked area of the $Si_3N_4$ film 128 is removed by etching, and an Ni/Au thin film 120 is then formed by deposition. Thus, the Ni/Au thin film 20 is formed (step E1). A portion of the Ni/Au thin film 120 which is formed on the mask 56 (not shown in FIG. 7) is removed together with the mask 56 prior to the next step.

The same procedure as in the step E1 is conducted to form the Ti/Au electrode 24. Specifically speaking, a mask 58 is formed on the resulting surface after the step E1, except for an area on the $Si_3N_4$ film 128 in which the Ti/Au electrode 24 for each LED 6 is to be formed. After an unmasked area of the $Si_3N_4$ film 128 is removed by etching, a Ti/Au film 124, which is a thin metal film, is applied by deposition. Thus, the Ti/Au electrode 24 is formed (step F1). A portion of the Ti/Au film 124 which is formed on the mask 58 (not shown in FIG. 7) is removed together with the mask 58 prior to the next step.

After this, a mask 60 is formed on the resulting surface after the step F1 except for an area in which the plated-through holes 42 and 46 are to be formed. An unmasked area of the resulting surface is etched, to form an opening 61 having a depth of 200 μm. Then, the opening 61 is filled with Pt by electroless deposition or the like (step G1). The mask 60 is removed prior to the next step.

Subsequently, a mask 62 is formed to mask the resulting surface after the step G1 except for areas in which the depressions 25 are to be formed. Unmasked areas of the resulting surface are removed by etching to such a depth that the p-GaN contact layer 18 is exposed, to form the depressions 25 (step H1). The mask 62 is removed prior to the next step.

After this, a mask 64 is formed so as to mask the resulting surface after the step H1 except for an area in which the ITO transparent electrode 22 is to be formed. Then, an ITO film 122 is applied by sputtering, to form the ITO transparent electrode 22 (step I1). A portion of the ITO film 122 which is formed on the mask 64 (not shown in FIG. 8) is removed together with the mask 64 prior to the next step.

A mask 66 is formed so as to mask the resulting surface after the step I1, except for areas in which the bridging wires 30, 40 and 44 are to be formed. Then, a Ti/Pt/Au film, which is a thin metal film, is applied by deposition, to form the Ti/Pt/Au bridging wires 30, 40 and 44 (step J1). A portion of the Ti/Pt/Au film which is formed on the mask 66 (not shown in FIG. 9) is removed together with the mask 66 prior to the next step.

After this, a back surface of the SiC substrate 104 is ground so that the thickness of the SiC substrate 104 becomes 150 μm. Thus, the plated-through holes 42 and 46 are exposed on the back surface of the SiC substrate 104 (step K1).

Subsequently, a mask (not shown in FIG. 9) is formed so as to mask the back surface of the SiC substrate 104 except for areas in which the power supply terminals 36 and 38 are to be formed. After this, a Ti/Pt/Au film, which is a metal thin film, is applied by deposition. Thus, the Ti/Pt/Au power supply terminals 36 and 38 are formed (step L1). A portion of the Ti/Pt/Au film which is formed on the mask (not shown in FIG. 9) is removed together with the mask prior to the next step.

After this, silicone in which particles of a yellow phosphor $(Sr, Ba)_2SiO_4:Eu^{2+}$ and fine particles of $SiO_2$ are dispersed is applied by printing so as to cover the exposed portion 7 and the LEDs 6. The silicone is then heated to be cured, to form a phosphor film 148. Subsequently, the phosphor film 148 is ground so that the thickness of the phosphor film 148 becomes 50 µm (step M1). Here, it should be noted that color of white light emitted from the LED array chip 2 is determined by a ratio between blue light from the light emitting layer 14 and yellow light from the phosphor 48. This ratio can be adjusted by changing the percentage of the phosphor particles included in the silicone resin and the thickness of the phosphor film 48. Specifically speaking, when the percentage of the phosphor particles is higher, or the thickness of the phosphor film 48 is larger, the ratio of the yellow light becomes higher. Here, a high ratio of the yellow light means that the white light has a low color temperature. According to the first embodiment, the silicone resin including the phosphor particles is first applied at a thickness larger than a designed thickness of the phosphor film 48. The applied resin is then ground after heated to be cured, to achieve the designed thickness. In this way, the phosphor film 48 can be formed at an even thickness. This can reduce unevenness of color with it being possible to produce white light having a predetermined color temperature reliably.

Lastly, individual LED array chips are obtained by dicing. Thus, the LED array chip 2 (shown in FIGS. 3A and 3B) is completed.

Here, the phosphor film 48 may be formed by applying a resin including a phosphor after a mesa etching step but before a dicing step in a conventional wafer fabrication process. However, a groove created by conventional mesa etching has such a width that only one or two phosphor particles can be arranged in a widthwise direction. In this case, blue light emitted from side surfaces of the light emitting layer 14 of each LED 6, to a large extent, goes through the phosphor film 48 without exciting the phosphor. As a result, the blue light emitted from the side surfaces becomes noticeable, which causes unevenness of color. According to the first embodiment, however, the resin including the phosphor is applied on side surfaces of the light emitting layer 14 (in the exposed portion 7 which surrounds the LEDs 7) at a thickness having an equal length to the width (W4) of the exposed portion 7. Here, the width (W4) of the exposed portion 7 is sufficiently larger than a diameter of the phosphor particle. As a consequence, the blue light emitted from the side surfaces of the light emitting layer 14 can appropriately excites the phosphor to be converted into yellow light. This reduces unevenness of color.

It is generally accepted that unevenness of color occurs only in a white LED that uses visible light having a spectral component of a wavelength within a range of 380 nm and 780 nm (purple to red) for an excitation light source. In other words, unevenness of color does not occur in a white LED having near-ultraviolet light as an excitation light source. However, ultraviolet light with a peak emission wavelength of 370 nm also has a spectral component of a wavelength no less than 380 nm (visible light). This means that a white LED using near-ultraviolet light as an excitation light source can have a problem of unevenness of color. Accordingly, the first embodiment is applicable to an LED having a light emitting layer that emits near-ultraviolet light in order to achieve the same effects of reducing unevenness of color. Which is to say, the first embodiment of the present invention is applicable to an LED including a light emitting layer that emits light including a spectral component of a wavelength, at least, within a range of 380 nm and 780 nm to reduce unevenness of color. The first embodiment is not only applied to an LED including a light emitting layer that emits blue light having a peak emission wavelength of 460 nm as described above.

Second Embodiment

Figure 10:
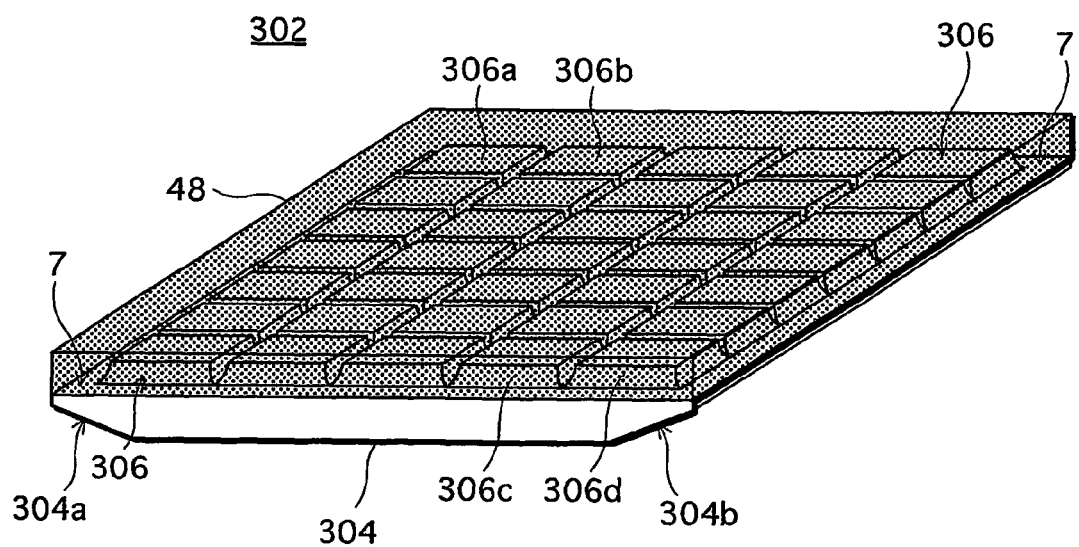
FIG. 10 is a perspective view illustrating an LED array chip relating to a second embodiment.

FIG. 10 is an external perspective view illustrating a construction of an LED array chip 302 relating to a second embodiment, which is one type of a semiconductor light emitting device.

The LED array chip 302 relating to the second embodiment basically has the same construction as the LED array chip 2 relating to the first embodiment (shown in FIGS. 3 to 5), except for a configuration of an uneven light extraction surface of each LED to enhance a light extraction efficiency, and a configuration of an SiC substrate. Common constituents of the LED array chip 302 are identified by the same reference numbers as in the first embodiment. The following description includes a brief or no mention of those common constituents, and mainly focuses on the different configurations between the LED array chips 2 and 302.

As shown in FIG. 10, a non-doped (highly resistant) SiC substrate 304 which constitutes the LED array chip 302 (hereinafter simply referred to as an SiC substrate 304) is partially removed. To be specific, a portion in a shape of a triangular prism is removed so as to include each of edges of a back surface of the SiC substrate 304 which are parallel to each other. The effects achieved by removed portions 304a and 304b are mentioned later.

Figure 11A:
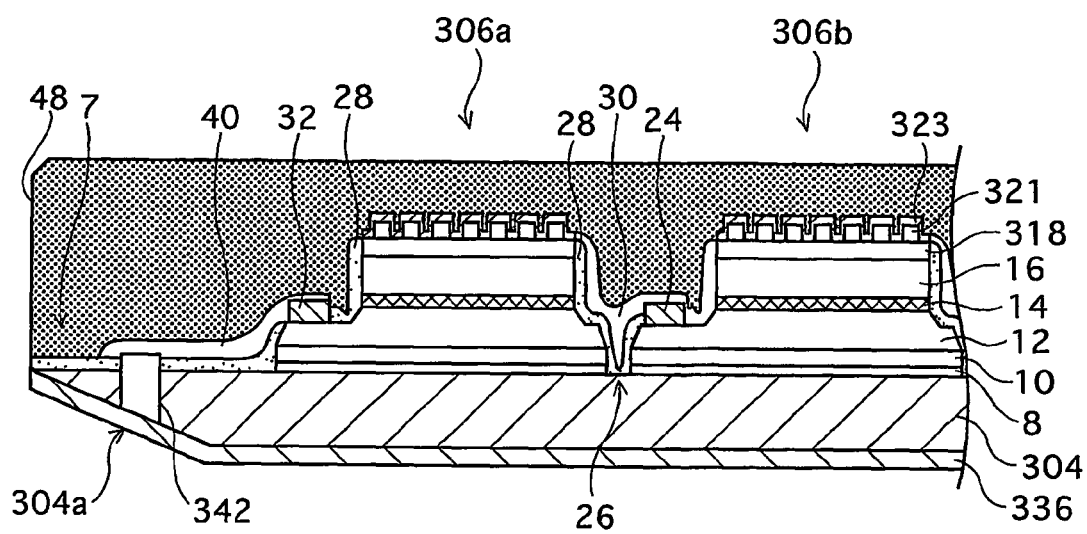
FIG. 11 includes cross-sectional views each illustrating part of the LED array chip relating to the second embodiment.
Figure 11B:
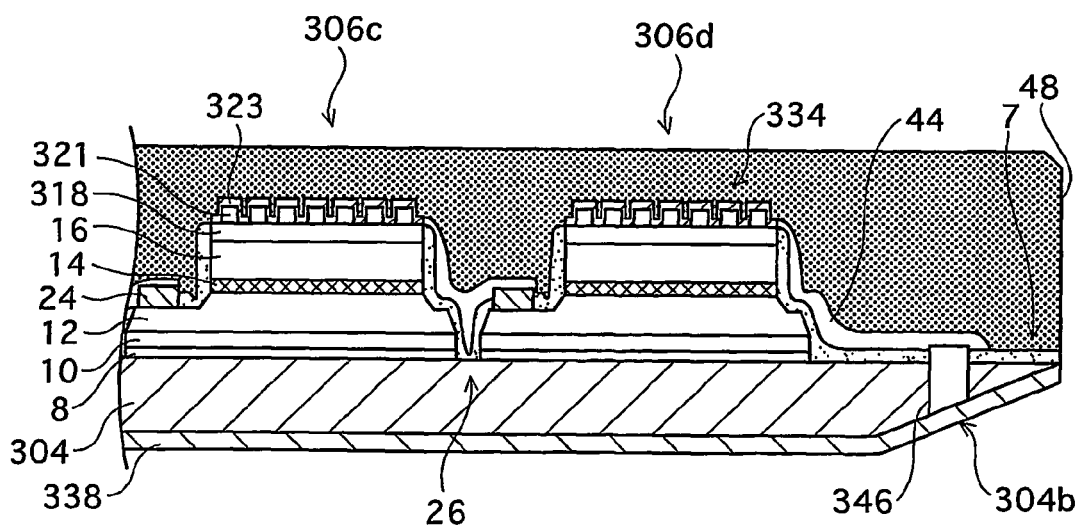

A plan view illustrating the LED array chip 302 after the phosphor film 48 is removed is substantially the same as the plan view illustrating the LED array chip 2 shown in FIG. 3B. FIG. 11A and FIG. 11B respectively illustrate a cross-section of the LED array chip 302 along a line corresponding to the line AA shown in FIG. 3B, and a cross-section of the LED array chip 302 along a line corresponding to the line BB shown in FIG. 3B. In other words, FIG. 11A shows an LED 306a of the first row and the first column, and an LED 306b of the first row and the second column, and FIG. 11B shows an LED 306c of the seventh row and the fourth column, and an LED 306d of the seventh row and the fifth column.

According to the first embodiment, the p-GaN contact layer 118 (see FIG. 6A) in the semiconductor multilayer structure formed on the SiC substrate 104 is partially removed (see step H1 in FIG. 8), to make the light extraction surface uneven (see the p-GaN contact layer 18 shown in FIG. 4A). According to the second embodiment, however, a p-GaN contact layer 318 is not processed as shown in FIGS. 11A and 11B. Instead, a tantalum oxide ($Ta_2O_5$) film 321 formed on the p-GaN contact layer 318 is partially removed to make a light extraction surface of each LED 306 uneven. An ITO transparent electrode 323 is formed as a p-electrode (an anode electrode) so as to run along the uneven $Ta_2O_5$ film 321. An ITO transparent electrode 323 of the LED 306d at a higher potential end is constituted as an anode electrode 334 of the LED array chip 302. Furthermore, a Ti/Au electrode 24 of the LED 306a at a lower potential end is constituted as the cathode electrode 32 of the LED array chip 302.

The removed portions 304a and 304b are formed on the back surface of the SiC substrate 304 which faces away from a semiconductor multilayer structure. Here, power supply terminals 336 and 338 formed on the back surface of the SiC substrate 304 are respectively also formed on the removed portions 304a and 304b, which are oblique surfaces.

Figure 14:
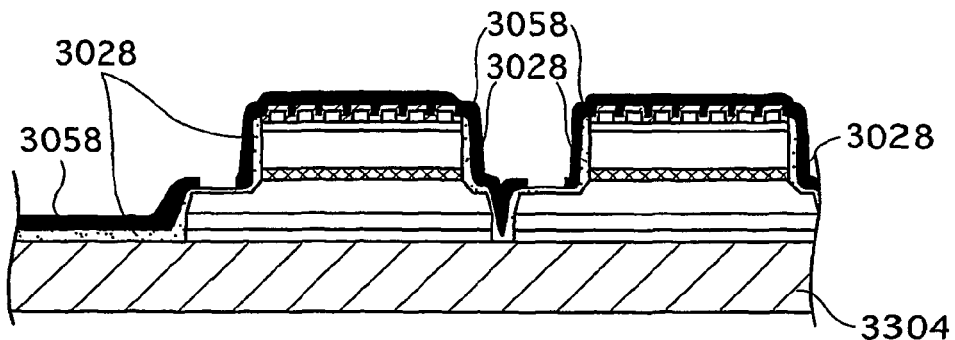
FIG. 14 is used to illustrate the manufacturing method for the LED array chip relating to the second embodiment.
Figure 14:
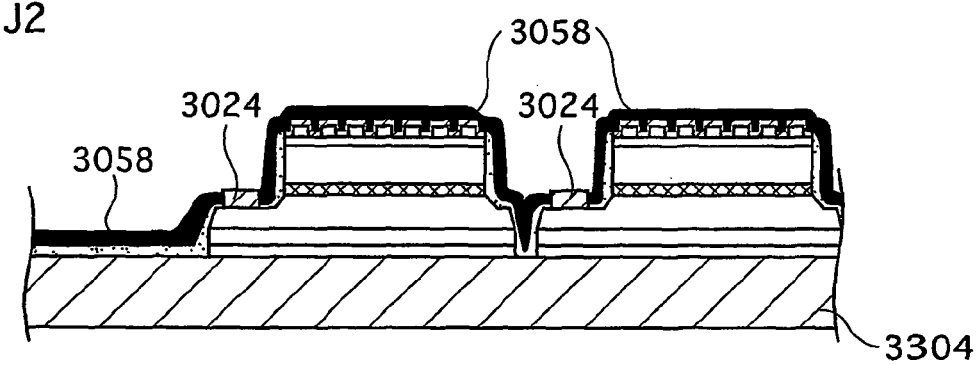
Figure 14:
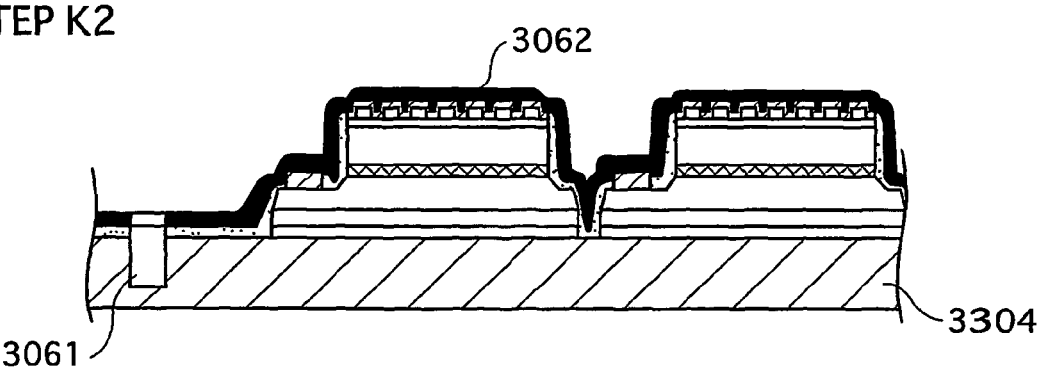
Figure 14:
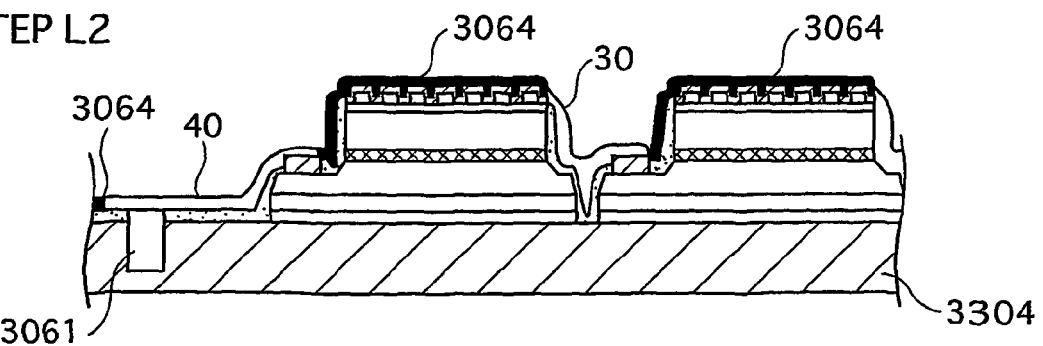
Figure 15:
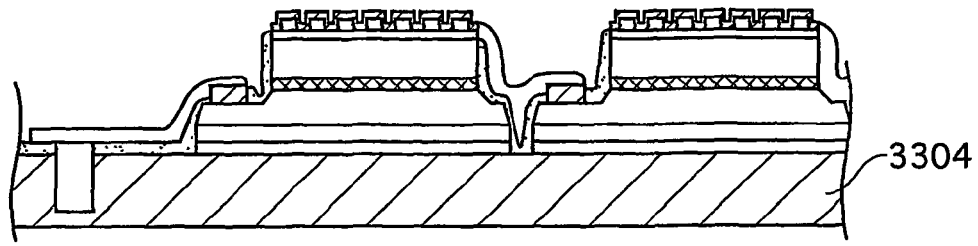
FIG. 15 is used to illustrate the manufacturing method for the LED array chip relating to the second embodiment.
Figure 15:
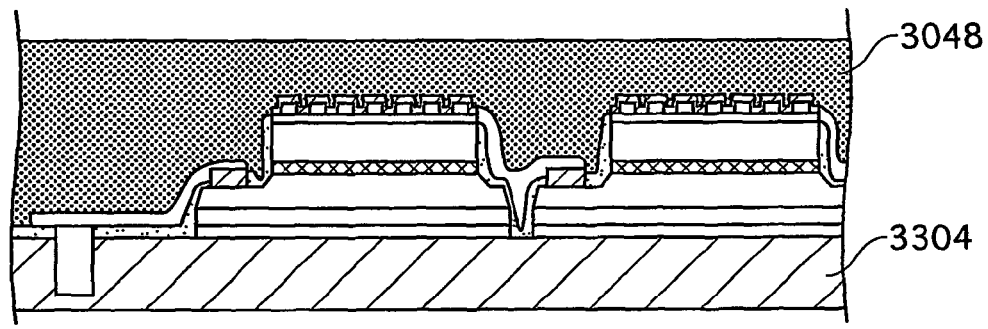
Figure 15:
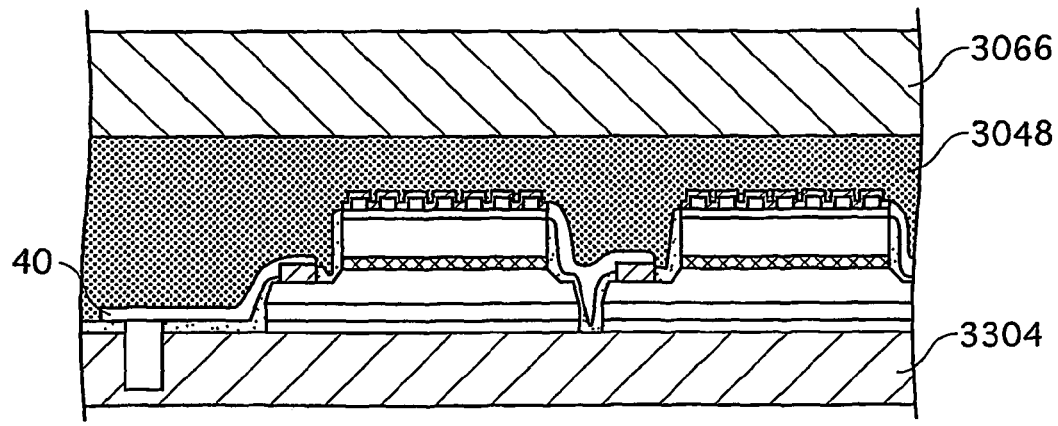
Figure 16:
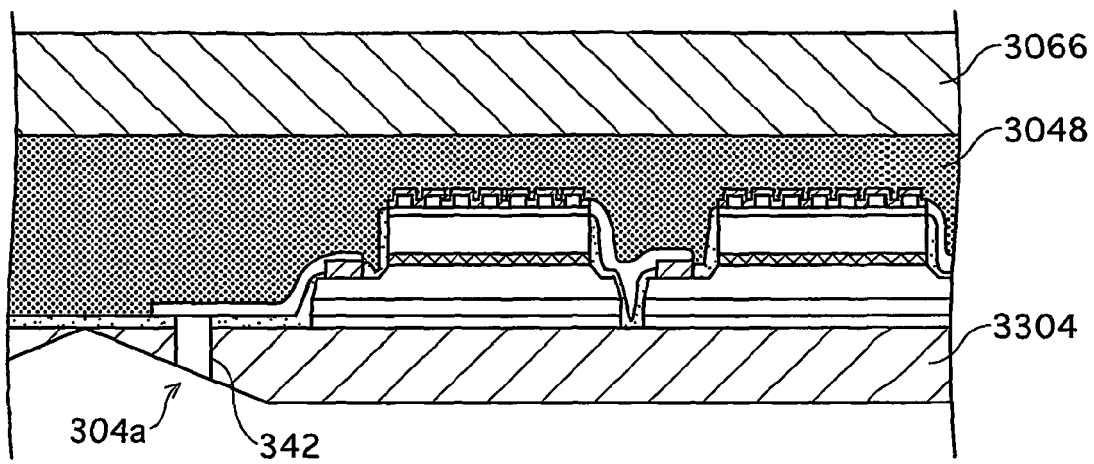
FIG. 16 is used to illustrate the manufacturing method for the LED array chip relating to the second embodiment.
Figure 16:
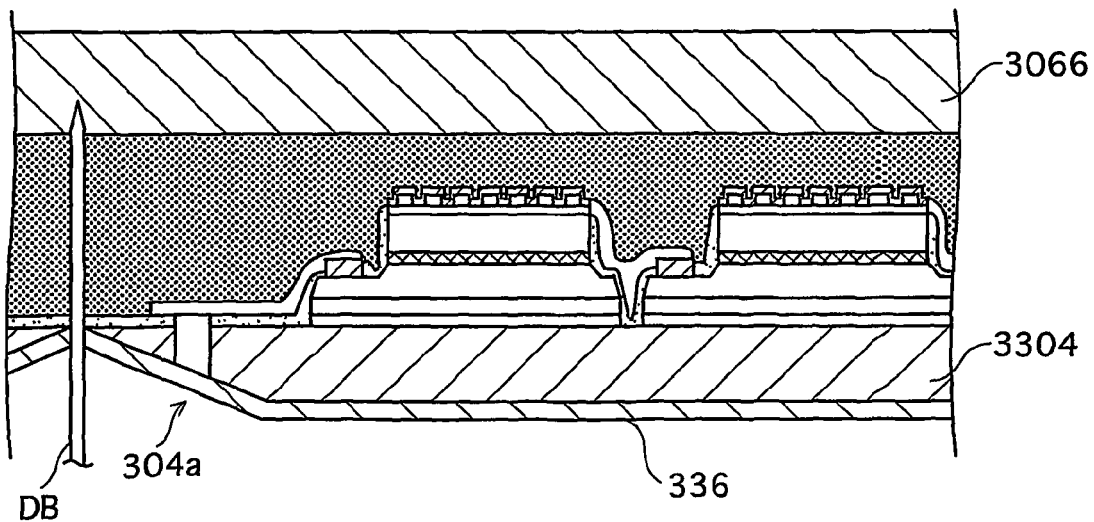

The removed portion 304a is formed in an area of the SiC substrate 304 in which a plated-through hole 342 is to be formed. The plated-through hole 342 electrically connects the power supply terminal 336 and the bridging wire 40 connected to the cathode electrode 32 of the LED array chip 302. On the other hand, the removed portion 304b is formed in an area of the SiC substrate 304 in which a plated-through hole 346 is to be formed. The plated-through hole 346 electrically connects the power supply terminal 338 and the bridging wire 44 connected to the anode electrode 334 of the LED array chip 302. The removed portions 304a and 304b are provided to reduce a thickness of the areas of the SiC substrate 304 in which the plated-through holes 342 and 346 are to be formed, compared with the rest of the SiC substrate 304. Therefore, openings 3061 (shown in FIG. 14) with a smaller depth are created to form the plated-through holes 342 and 346 during a wafer fabrication process. This makes it possible to shorten a time required for the step of forming the plated-through holes 342 and 346.

The following part describes a manufacturing method for this LED array chip 302, with reference to FIGS. 12 to 16. Here, the manufacturing method includes the same steps as the manufacturing method for the LED array chip 2 relating to the first embodiment (FIGS. 6 to 9), and those same steps are only briefly mentioned. In FIGS. 12 to 16, a material to form each constituent of the LED array chip 302 is identified by a four-digit number whose first digit is three. The last three digits of the four-digit number represents a reference numeral identifying the corresponding constituent of the LED array chip 302.

Figure 12:
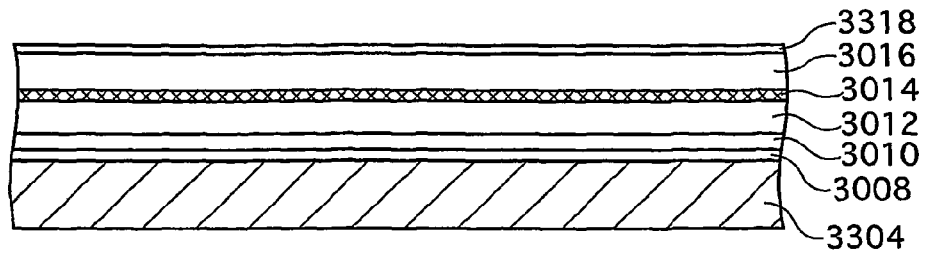
FIG. 12 is used to illustrate a manufacturing method for the LED array chip relating to the second embodiment.
Figure 12:
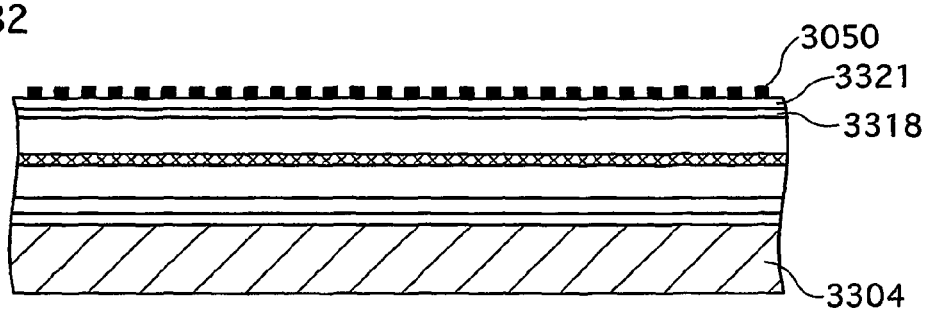
Figure 12:
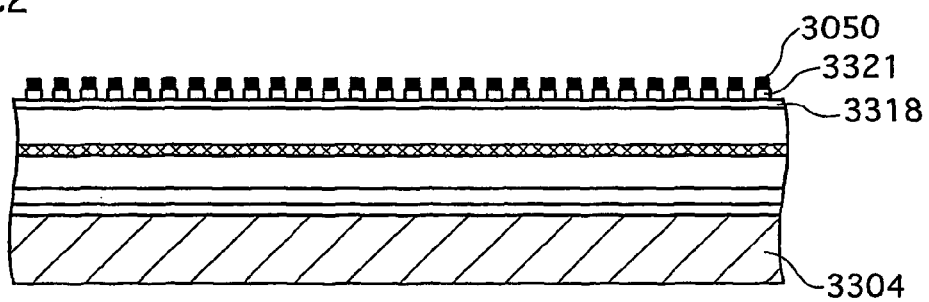
Figure 12:
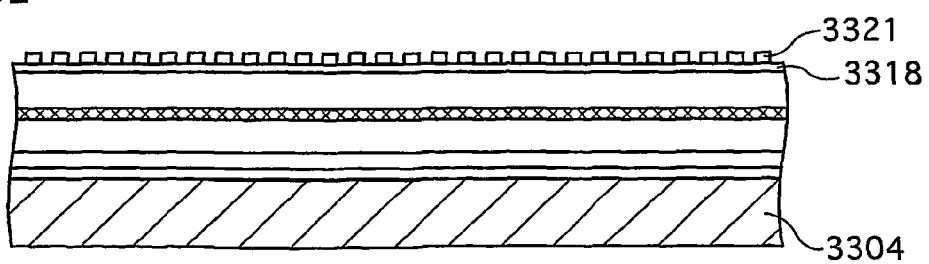
Figure 13:
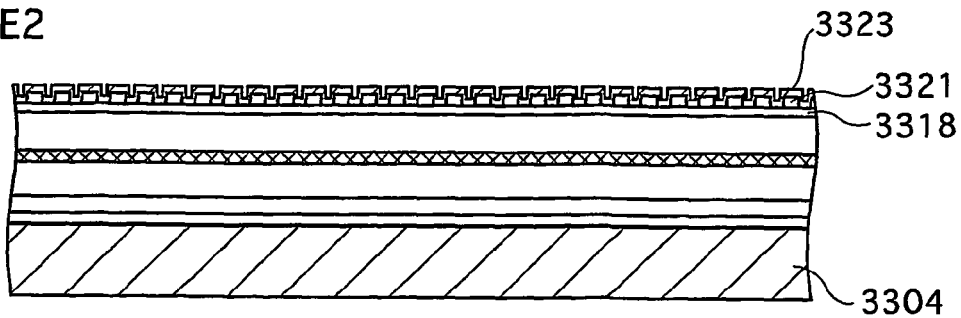
FIG. 13 is used to illustrate the manufacturing method for the LED array chip relating to the second embodiment.
Figure 13:
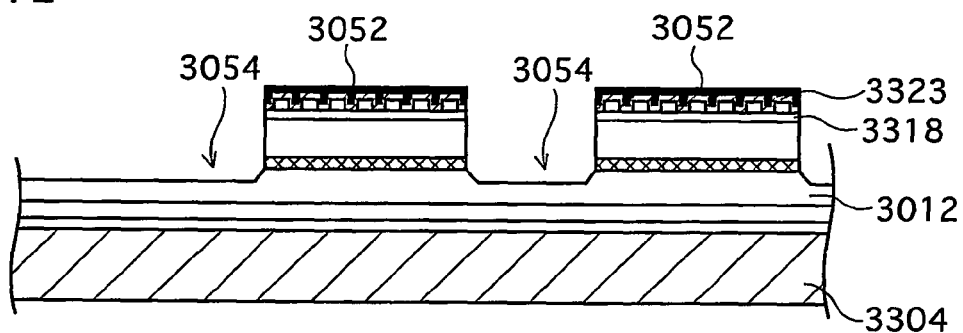
Figure 13:
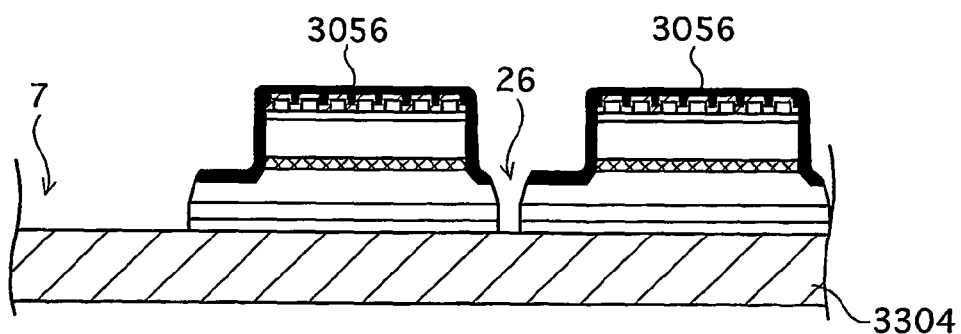
Figure 13:
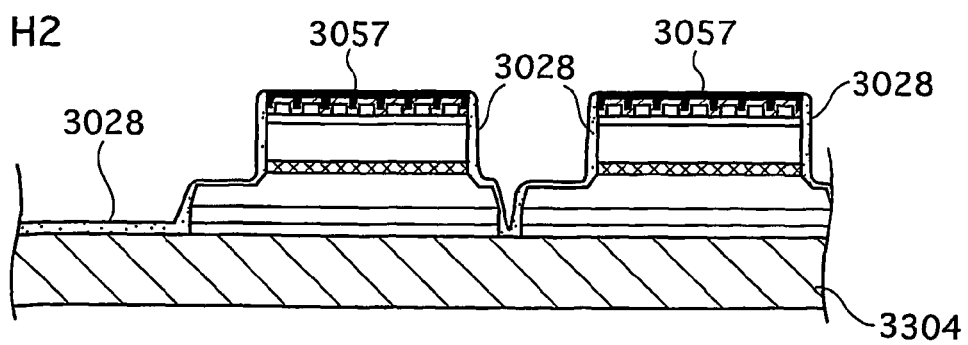

Firstly, as shown in FIG. 12, an n-AlGaN buffer layer 3008, a DBR layer 3010 composed of 30 periods of n-AlGaN/GaN, an n-GaN clad layer 3012, an InGaN/GaN MQW light emitting layer 3014, a p-GaN clad layer 3016, and a p-GaN contact layer 3318 are formed on a non-doped SiC substrate 3304 in the stated order using a MOCVD method (step A2). Here, the non-doped SiC substrate 3304 has a diameter of two inches and a thickness of 300 μm, as well as the non-doped SiC substrate 104 in the first embodiment.

After this, a $Ta_2O_5$ film 3321 is formed on the p-GaN contact layer 3318 by sputtering or the sol-gel process. Following this, a resist is formed on the $Ta_2O_5$ film 3321, and partially removed by stepper exposure. Thus, a resist mask 3050 is formed (step B2).

Subsequently, a portion of the $Ta_2O_5$ film 3321 which is not covered by the resist mask 3050 is removed by etching (step C2), and the resist mask 3050 is then removed (step D2). After this, an ITO film 3323 is formed so as to run along the uneven $Ta_2O_5$ film 3321 by sputtering. Thus, an uneven light extraction surface is formed to improve a light extraction efficiency (step E2).

After this, a mask 3052 is formed on the ITO film 3323, so as to cover an area in which the ITO transparent electrode 323 (shown in FIGS. 11A and 11B) is to be formed. An unmasked area of a lamination composed of the layers and films 3008, 3010, 3012, 3014, 3016, 3318, 3321 and 3323 is removed by etching to a depth of approximately half of the thickness of the n-GaN clad layer 3012 (step F2). Thus, a surface 3054 to connect the Ti/Au electrode 24 (an n-electrode formation surface) and the ITO transparent electrode 323 are formed. The mask 3052 is removed prior to the next step.

After this, a mask 3056 is formed on the resulting surface after the step F2 except for areas in which the exposed portion 7 and the division groove 26 are to be formed. An unmasked area of a lamination composed of the layers 3012, 3010 and 3008 is removed by etching to such a depth that the SiC substrate 3304 is exposed. Thus, the exposed portion 7 and the division groove 26 are created (step G2). After the etching is completed, the mask 3056 is removed prior to the next step.

Subsequently, after a mask 3057 is formed on the ITO transparent electrode 323, an $Si_3N_4$ film 3028, which is an insulating film, is formed by sputtering or the like for insulation and surface protection (step H2). A portion of the $Si_3N_4$ film 3028 formed on the mask 3057 (not shown in FIG. 13) is removed together with the mask 3057 prior to the next step.

A mask 3058 is formed on the resulting surface after the step H2 except for an area in which the Ti/Au electrode 24 is to be formed, and an unmasked area of the $Si_3N_4$ film 3028 is removed by etching (step I2).

After this, a Ti/Au film 3024, which is a thin metal film, is formed by deposition, to form the Ti/Au electrode 24 (step J2). A portion of the Ti/Au film 3024 which is formed on the mask 3058 (not shown in FIG. 14) is removed together with the mask 3058 prior to the next step.

A mask 3062 is formed on the resulting surface after the step J2 except for an area in which each of the plated-through hole 342 and the plated-through hole 346 is to be formed. After this, etching is performed in an unmasked area so as to create the opening 3061 having a depth of 100 μm. The opening 3061 is then filled with Pt by means of electroless deposition or the like (step K2). The mask 3062 is removed prior to the next step. As mentioned before, the opening 3061 has a smaller depth than the opening 61 in the first embodiment (see FIG. 8). Therefore, a time for the etching step (step K2) is shortened.

A mask 3064 is formed on the resulting surface after the step K2 except for areas in which the bridging wires 30, 40 and 44 are to be formed. After this, a Ti/Pt/Au film, which is a thin metal film, is formed by deposition. Thus, the Ti/Pt/Au bridging wires 30, 40 and 44 (the bridging wire 44 is not shown in FIG. 14) are formed (step L2). A portion of the Ti/Pt/Au film which is formed on the mask 3064 (not shown in FIG. 14) is removed together with the mask 3064 prior to the next step.

A back surface of the SiC substrate 3304 is ground, so that the thickness of the SiC substrate 3304 becomes 150 μm (step M2).

After this, silicone in which particles of a yellow phosphor $(Sr, Ba)_2SiO_4:Eu^{2+}$ and fine particles of $SiO_2$ are dispersed is applied by printing so as to cover the exposed portion 7 and the LEDs 306. The silicone is heated to be cured, to form a phosphor film 3048. Subsequently, the phosphor film 3048 is ground so that the thickness of the phosphor film 3048 becomes 50 μm (step N2). The grinding achieves the same effects as in the first embodiment.

Subsequently, a dicing sheet 3066, which is a macromolecule film, is adhered to the phosphor film 3048 (step O2).

The back surface of the SiC substrate 3304 is partially removed by a V-shaped blade (not shown in FIG. 16), so that a groove having a V-shaped cross-section is formed. Thus, the removed portion 304a (304b) is created (step P2), and the plated-through hole 342 (346) is exposed.

A mask (not shown in FIG. 16) is formed on the back surface of the SiC substrate 3304 so as not to cover areas in which the power supply terminals 336 and 338 are to be formed. After this, a Ti/Pt/Au film, which is a thin metal film, is formed by deposition on the back surface of the SiC substrate 3304. Thus, the Ti/Pt/Au power supply terminals 336 and 338 are formed. A portion of the Ti/Pt/Au film which is formed on the mask (not shown in FIG. 16) is removed together with the mask. Lastly, individual LED array chips are created by dicing (step Q2). In this way, the LED array chip 302 (shown in FIG. 10) is completed.

Third Embodiment

According to the first and second embodiments, the anode electrode (34 and 334) and the cathode electrode (32) of the LED array chip (2 and 302) are electrically connected to the power supply terminals (36 and 38, 336 and 338) on the back surface of the SiC substrate (4 and 304) by conductive members including the plated-through holes (42 and 46, 342 and 346) provided in the SiC substrate (4 and 304). According to a third embodiment, however, such conductive members include conductive films formed on side surfaces of an SiC substrate, instead of the plated-through holes (42 and 46, 342 and 346). An LED array chip 402 relating to the third embodiment basically has the same construction as the LED array chip 302 relating to the second embodiment, except for that conductive films are provided instead of the plated-through holes (42 and 46, 342 and 346) and that the removed portions 304a and 304b are not created. Common constituents of the LED array chip 402 are identified by the same reference numerals as in the second embodiment. The following has a brief or no mention of those common constituents, and describes the LED array chip 402 with main focus on its difference from the LED array chip 302.

Figure 17A:
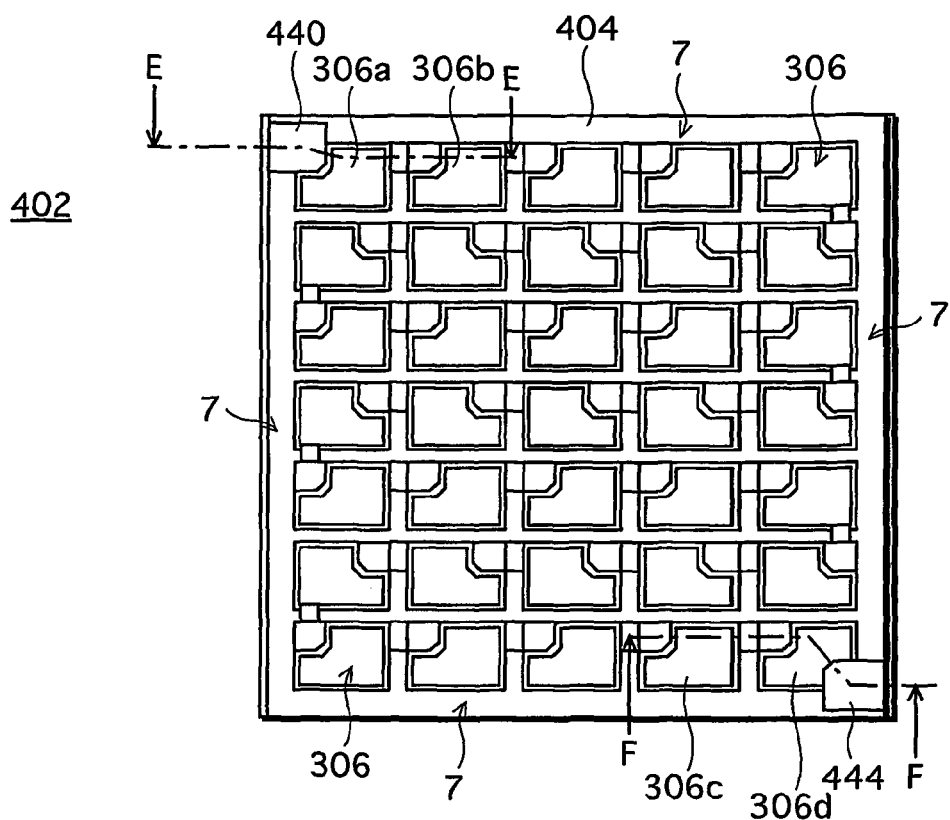
FIG. 17A is a plan view illustrating an LED array chip relating to a third embodiment.
Figure 17B:
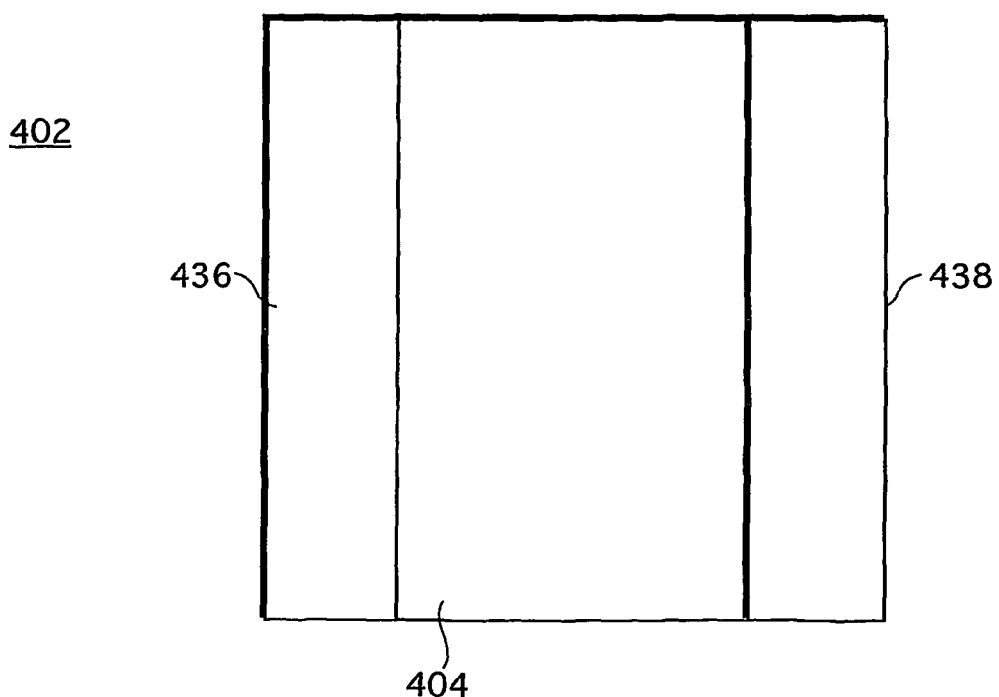
FIG. 17B is a bottom plan view illustrating the LED array chip relating to the third embodiment.

FIG. 17A is a plan view illustrating the LED array chip 402, and FIG. 17B is a bottom plan view illustrating the LED array chip 402. FIG. 17A, as well as FIG. 3B, does not show the phosphor film 48.

As shown in FIG. 17A, the LEDs 306 are arranged in a matrix on a front surface of an SiC substrate 404, as in the first and second embodiments.

As shown in FIG. 17B, power supply terminals 436 and 438 are formed on a back surface of the SiC substrate 404.

Figure 18A:
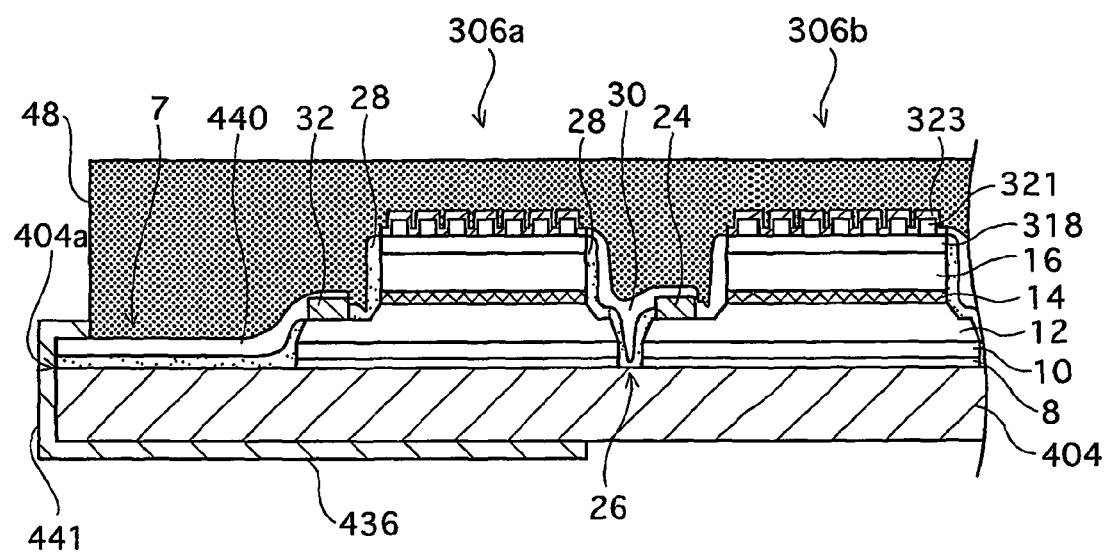
FIG. 18 includes cross-sectional views each illustrating part of the LED array chip relating to the third embodiment.
Figure 18B:
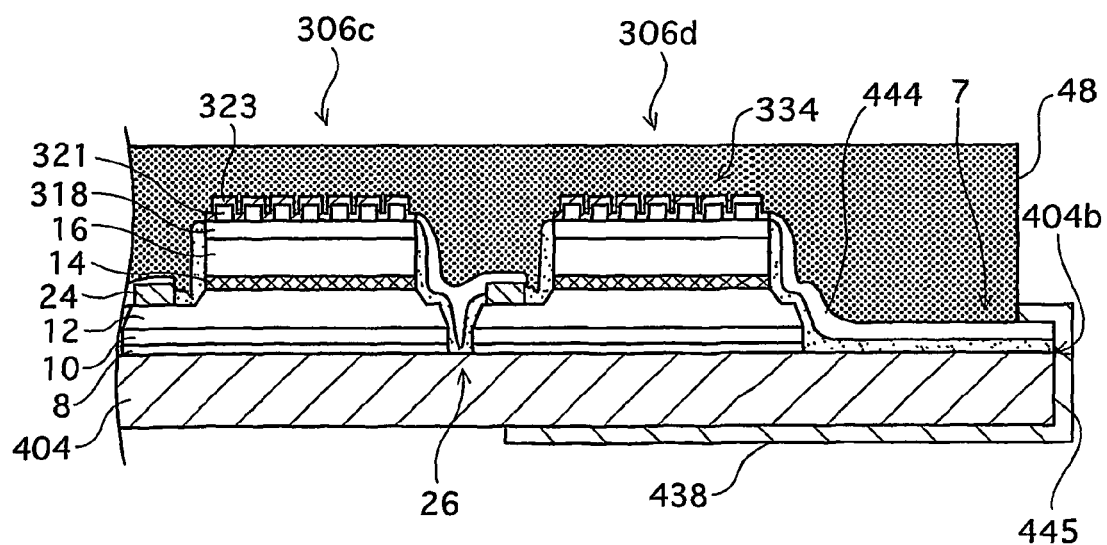

FIG. 18A illustrates a cross-section of the LED array chip 402 along a line EE shown in FIG. 17A, and FIG. 18B illustrates a cross-section of the LED array chip 402 along a line FF shown in FIG. 17A.

As shown in FIG. 18A, a bridging wire 440 that is connected to the cathode electrode 32 of the LED array chip 402 extends to reach an edge 404a of the SiC substrate 404. As shown in FIG. 18B, similarly, a bridging wire 444 that is connected to the anode electrode 334 of the LED array chip 402 extends to reach an edge 404b of the SiC substrate 404.

As shown in FIG. 18A, the bridging wire 440 is electrically connected to the power supply terminal 436 by a wiring 441 which is formed on a side surface of the SiC substrate 404. The wiring 441 is a conductive film made of Au plating. As shown in FIG. 18B, similarly, the bridging wire 444 is electrically connected to the power supply terminal 438 by a wiring 445 which is formed on a side surface of the SiC substrate 404. The wiring 445 is a conductive film made of Au plating. The wirings 441 and 445 each extend, to be formed on the front surface of the SiC substrate 404. This strengthens the electrical connection between the wiring 441 and the bridging wire 440, and the electrical connection between the wiring 445 and the bridging wire 444.

Power can be supplied to the 35 LEDs 306 which are connected together in series, through the power supply terminals 436 and 438.

The following part describes a manufacturing method for this LED array chip 402, with reference to FIGS. 19 to 22.

The first 15 steps of the manufacturing method (process) for the LED array chip 402 are the same as the steps from the step A2 to the step O2 of the manufacturing method for the LED array chip 302, except for that (i) the plated-through holes (342 and 346) are not provided, (ii) the bridging wires 440 and 444 respectively connected to the anode electrode 334 and the cathode electrode 32 of the LED array chip 402 have a slightly different configuration from the bridging wires 40 and 44, and (iii) the phosphor film 48 is not formed in a portion, on the SiC substrate 404, in which the wirings 441 and 445 are to be formed. The following part describes steps conducted after a step corresponding to the step O2 is completed.

Figure 19A:
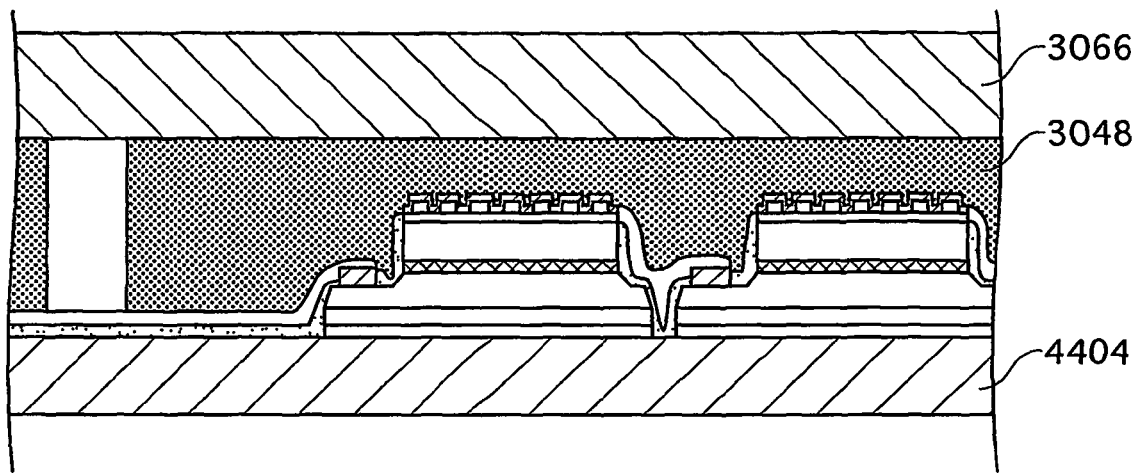
FIG. 19 is used to illustrate a manufacturing method for the LED array chip relating to the third embodiment.

FIG. 19A is a cross-sectional view illustrating part of a wafer 4050 (shown in FIG. 21A) observed when the step corresponding to the step O2 has been completed.

At this stage of the manufacturing method, a wafer fabrication process for one of the main surfaces of an SiC substrate 4404 (i.e. a semiconductor multilayer structure formation surface) has been completed. Which is to say, individual LED array chips (hereinafter referred to as chip elements) are formed in a matrix. The first dicing sheet 3066 is adhered to the phosphor film 3048.

Figure 21A:
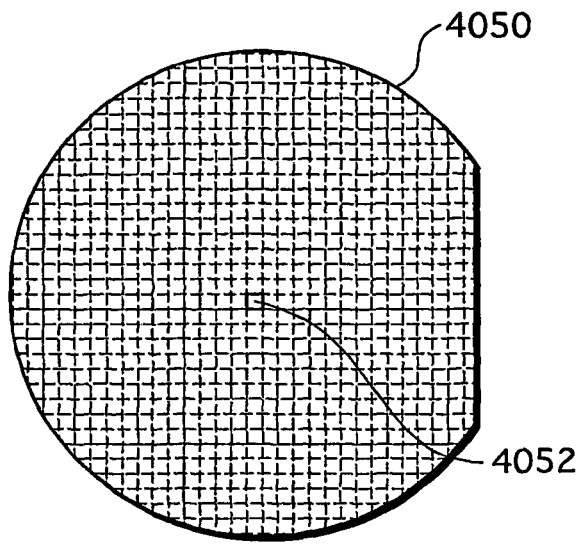
FIG. 21 is used to illustrate the manufacturing method for the LED array chip relating to the third embodiment.
Figure 21B:
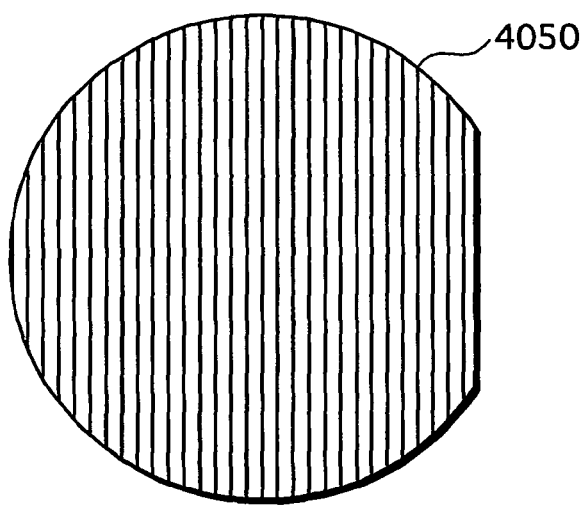

FIG. 21A illustrates the wafer 4050 when seen from a side of a front surface of the SiC substrate 4404. It should be noted that FIG. 21A does not show the first dicing sheet 3066 (shown in FIG. 19A). As shown by dashed lines in FIG. 21A, chip elements 4052 are arranged in a matrix.

Figure 19B:
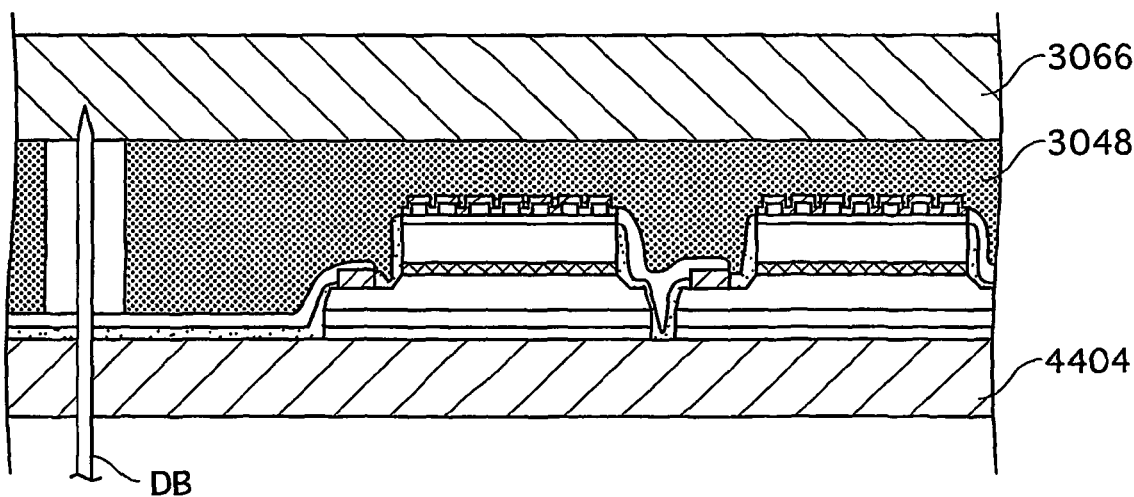

Each string of chip elements 4052 (shown in FIG. 21B) is cut off from the wafer 4050 using dicing blades (DB), as in a normal dicing step shown in FIG. 19B.

Figure 21C:
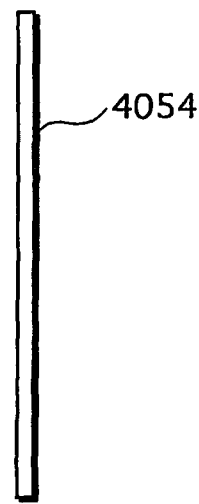

FIG. 21C shows a string of chip elements 4052 (hereinafter referred to as a chip element string 4054). In the strip-like chip element string 4054, chip elements 4052 are arranged in such a manner that an end of each of the bridging wire 440 and the bridging wire 444 (shown in FIG. 17A) is located at a longer edge of the chip element string 4054. In other words, the chip element string 4054 is cut off from the wafer 4050 so that the chip elements 4052 are arranged in this manner in the chip element string 4054.

Figure 22A:
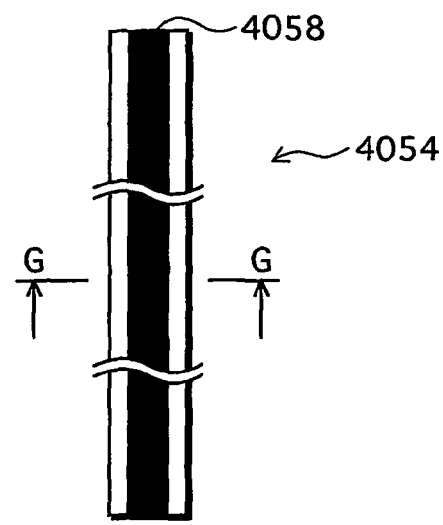
FIG. 22 is used to illustrate the manufacturing method for the LED array chip relating to the third embodiment.
Figure 22B:
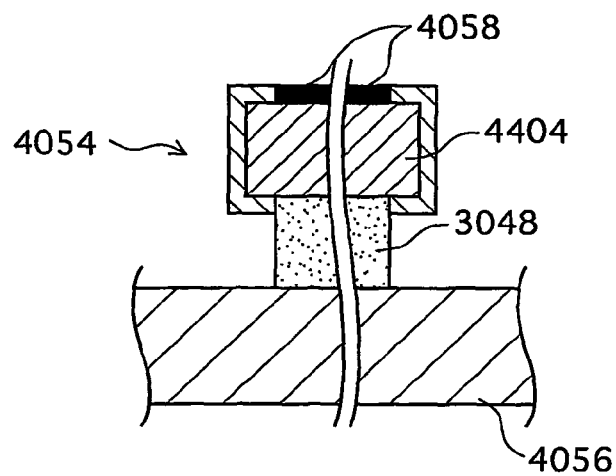

After the first dicing sheet 3066 is removed, the chip element string 4054 is adhered to a different dicing sheet 4056 (a second dicing sheet) in such a manner that the phosphor film 3048 is in contact with the second dicing sheet 4056, as shown in FIG. 22B. Here, FIG. 22B illustrates a schematic cross-section along a line GG shown in FIG. 22A, which is an enlargement view of the chip element string 4054.

Subsequently, a mask 4058 is formed on the back surface of the SiC substrate 4404, so as not to cover areas in which the power supply terminals 436 and 438 (shown in FIGS. 18A and 18B) are to be formed. In other words, the mask 4058 is formed like a strip so as to extend in a lengthwise direction of the chip element string 4054 with maintaining an area having a predetermined width along each longer edge. Alternatively, before the wafer 4050 is cut into chip element strings 4054, the mask 4058 may be formed in stripes in a predetermined area on a back surface of the wafer 4050.

Figure 20A:
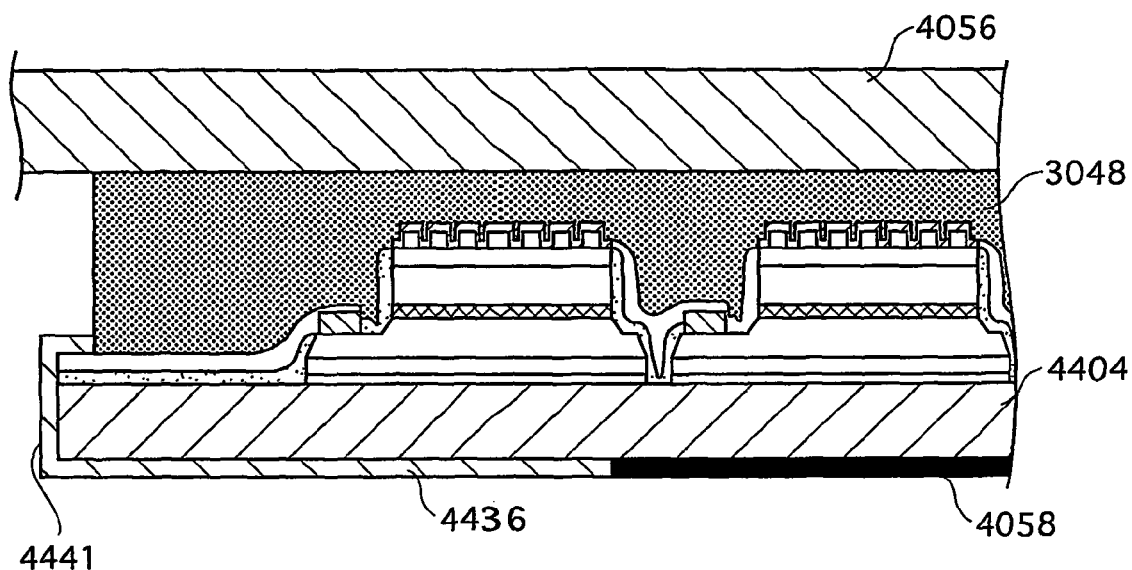
FIG. 20 is used to illustrate the manufacturing method for the LED array chip relating to the third embodiment.
Figure 20B:
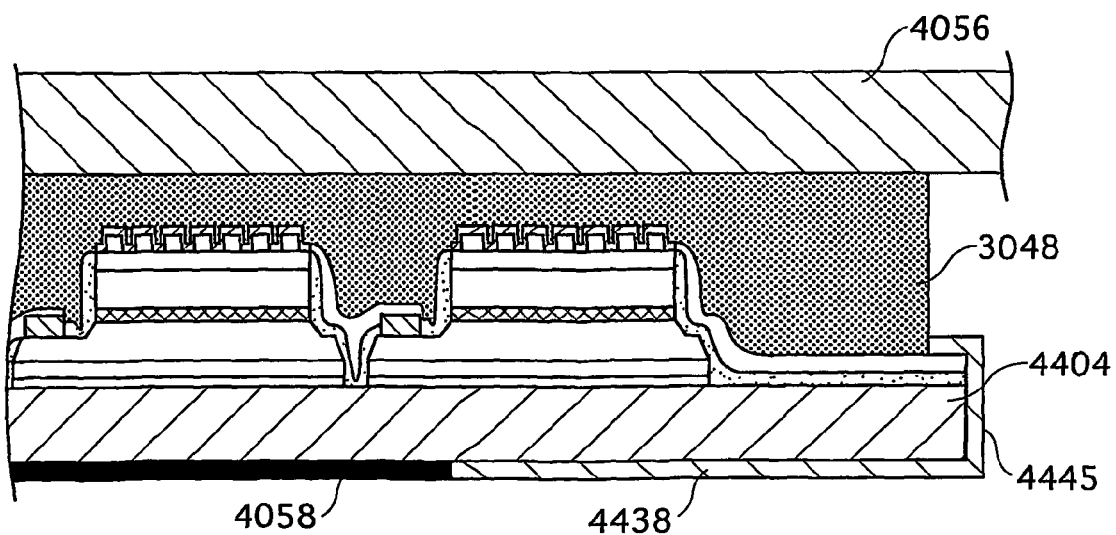

After the mask 4058 is formed, a Ti/Au thin film undercoating (not shown in FIG. 20) is applied by electron beam evaporation or the like in areas of the exposed surfaces of the SiC substrate 4404 which are not covered by the mask 4058, and an Au plating film is then formed by deposition. Thus, power supply terminals 4436 and 4438 and wirings 4441 and 4445 are formed, as shown in FIGS. 20A and 20B.

Figure 22C:
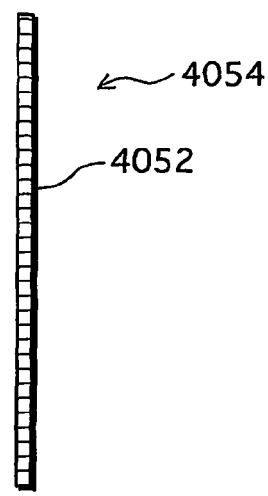

A portion of the Au plating film which is deposited on the mask 4058 (not shown in FIG. 20) is removed together with the mask 4058. After this, individual LED array chips are obtained as shown in FIG. 22C using dicing blades (not shown in FIG. 22C). Thus, the LED array chip 402 (shown in FIG. 17) is completed.

Fourth Embodiment

Figure 23:
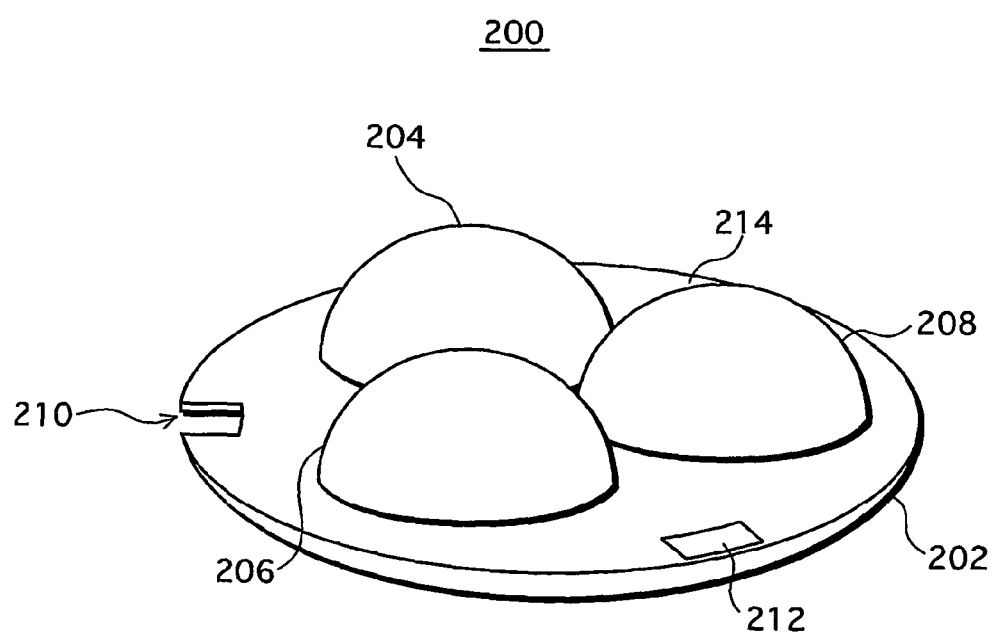
FIG. 23 is a perspective view illustrating an LED module.

FIG. 23 is an external perspective view illustrating a white LED module 200, which is one type of a lighting module, including the LED array chip 2 relating to the first embodiment (hereinafter simply referred to as an LED module 200). Instead of the LED array chip 2, the LED array chip 302 relating to the second embodiment (shown in FIG. 10 and the like), or the LED array chip 402 relating to the third embodiment (shown in FIG. 17 and the like) can be used. The LED module 200 is attached to a lighting unit 240 (mentioned later and shown in FIG. 26).

The LED module 200 includes a ceramics substrate 202 that is in a shape of a circle having a diameter of 5 cm and is made of aluminum nitride (AlN) and three lenses 204, 206 and 208 made of glass. A guiding depression 210 used to attach the LED module 200 to the lighting unit 240 and terminals 212 and 214 to receive a power supply from the lighting unit 240 are provided in the ceramics substrate 202.

Figure 24A:
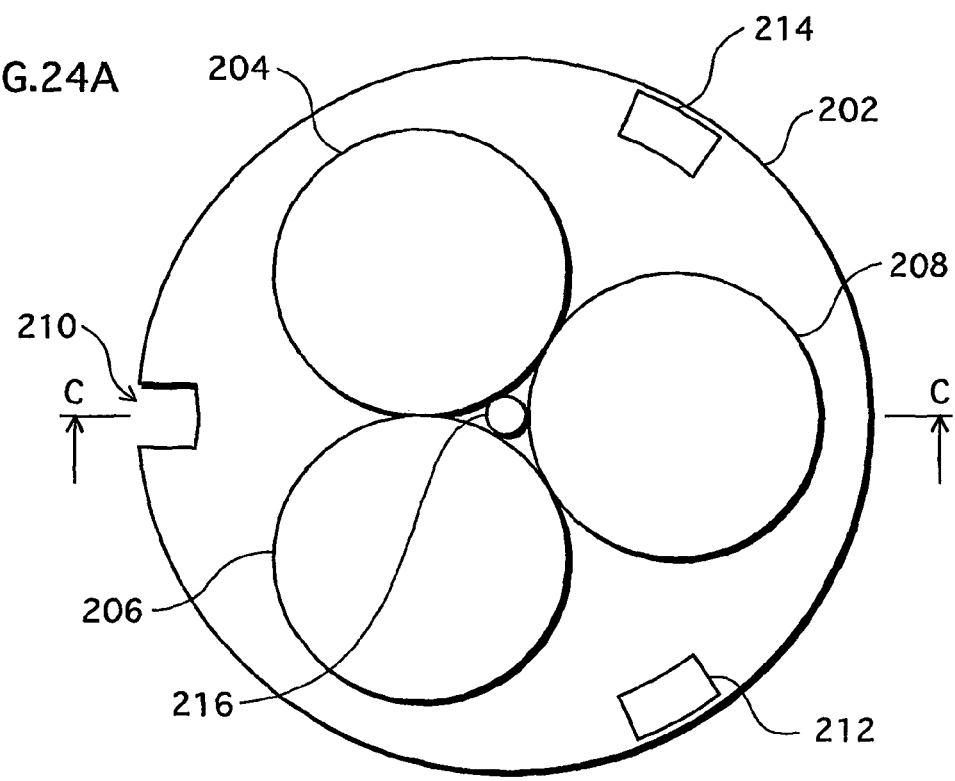
FIG. 24A is a plan view illustrating the LED module.
Figure 24B:
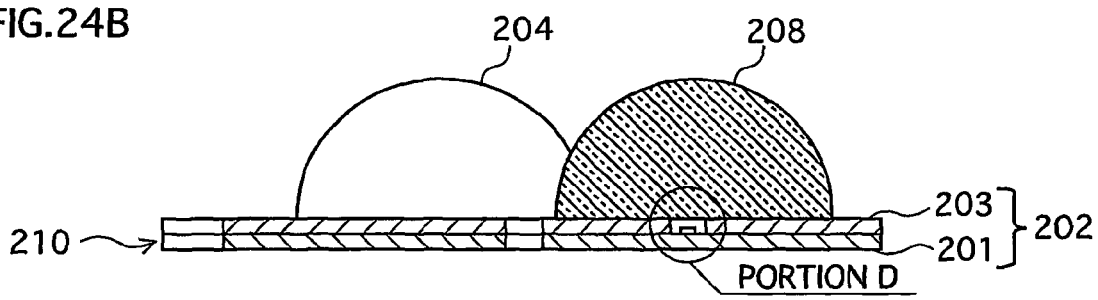
FIG. 24B illustrates a cross-section along a line CC shown in FIG. 24A.
Figure 24C:
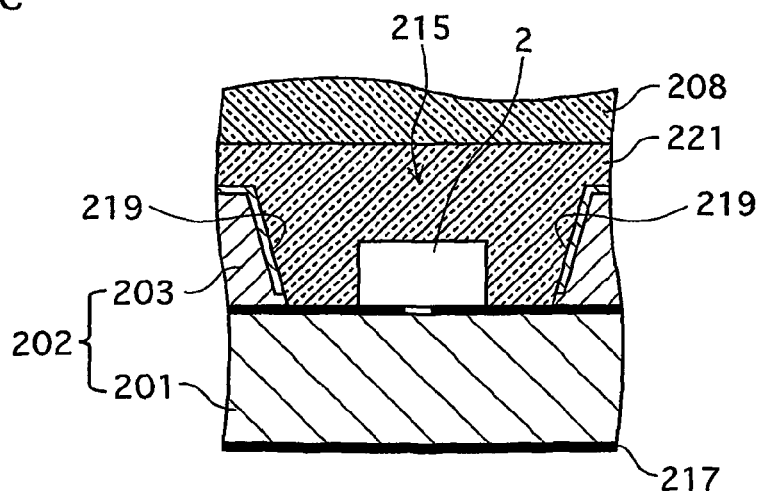
FIG. 24C is an enlargement view illustrating a portion D shown in FIG. 24B.

FIG. 24A is a plan view illustrating the LED module 200, FIG. 24B illustrates a cross-section along a line CC shown in FIG. 24A, and FIG. 24C is an enlargement view illustrating a portion D shown in FIG. 24B.

As shown in FIGS. 24A and 24B, a guiding hole (a through hole) 216 is provided in the center of the ceramics substrate 202 to attach the LED module 200 to the lighting unit 240. As shown in FIG. 24C, a gold plating 217 is applied to a back surface of the ceramics substrate 202 for improving heat dissipation.

The LED array chip 2 is mounted at a location, on the ceramics substrate 202, corresponding to a center of each of the lenses 204, 206 and 208 having a shape of a circle as shown in FIG. 24A. In total, three LED array chips 2 are mounted on the ceramics substrate 202.

Here, the ceramics substrate 202 is made up of two ceramics substrates 201 and 203 each of which has a thickness of 0.5 mm and is mainly made of AlN. The ceramics substrates 201 and 203 may be made of $Al_2O_3$, BN, MgO, ZnO, SiC and diamond, instead of AlN.

The LED array chips 2 are mounted on a front surface of the lower ceramics substrate 201 in such a manner that the power supply terminals 36 and 38 (shown in FIGS. 4A, 4B and 5C) are faced to the ceramics substrate 201. Taper through holes 215 are provided in the upper ceramics substrate 203, so as to create spaces for mounting the LED array chips 2. In other words, the ceramics substrate 202 has depressions each of which increases in diameter toward an open end. The LED array chips 2 are mounted on the bottom surfaces of the depressions. Here, the depressions in the ceramic substrate 202 may have a hemispherical shape, instead of a taper shape.

An aluminum reflective film 219 is formed, at a substantially even thickness, on a slope (wall) of each through hole 215 provided in the upper ceramics substrate 203 and on a front surface of the ceramics substrate 203. Thus, a reflective mirror (hole) is formed. The through hole 215 is designed so that white light emitted from a side surface of the LED array chip 2 is reflected by the aluminum reflective film 219 formed on the wall of the through hole 215, in a direction substantially perpendicular to a main surface of the ceramics substrate 203.

A cathode pad 218 and an anode pad 220 (shown in FIG. 25B) are provided at the location, on the front surface of the ceramics substrate 201, where each LED array chip 2 is to be mounted. Each of the cathode pad 218 and the anode pad 220 is made up of nickel (Ni) plating and then gold (Au) plating applied on copper (Cu). The LED array chip 2 is mounted on the ceramics substrate 201 in such a manner that the SiC substrate 4 is faced down to the ceramics substrate 201. Here, the power supply terminals 36 and 38 are respectively connected to the cathode pad 218 and the anode pad 220 using solder. Instead of solder, a gold bump or a silver paste may be used.

Here, in the case of a conventional white LED, a phosphor film is formed on and around a bare chip, after the bare chip is mounted on a mounting substrate. On the other hand, the LED array chip 2 has the phosphor film 48. Therefore, the LED array chip 2 can be mounted in the reflective hole that has already been formed, in such a manner that the phosphor film 48 is not in contact with the wall of the reflective hole. Accordingly, a printed wiring board with a reflective film can be used, so that a semiconductor light emitting device is mounted at a designed location substantially precisely in relation to a reflective hole. Furthermore, a diameter of the reflective hole can be made as small as possible. As a result, a light collection efficiency is improved, and the lighting module 200 can be minimized in size.

Before being mounted on the ceramics substrate 201, the LED array chips 2 have been tested for their optical performance, such as unevenness of color, and have passed the test. The LED array chips 2 can be tested for their optical performance before being mounted because the LED array chip 2 relating to the first embodiment includes the phosphor film 48, and can emit white light by itself. Thus, it can be prevented that the LED module 200 including the LED array chips 2 is rejected due to poor optical performance of the LED array chips 2. Consequently, a ratio of accepted finished products (LED modules 200) to all finished products is improved.

The lenses 204, 206 and 208 are adhered to the ceramics substrate 203 using an adhesive agent 221. The adhesive agent 221 may be a silicone resin, an epoxy resin or the like.

The three LED array chips 2 are connected in parallel by a wiring pattern formed on the front surface of the ceramics substrate 201.

Figure 25A:
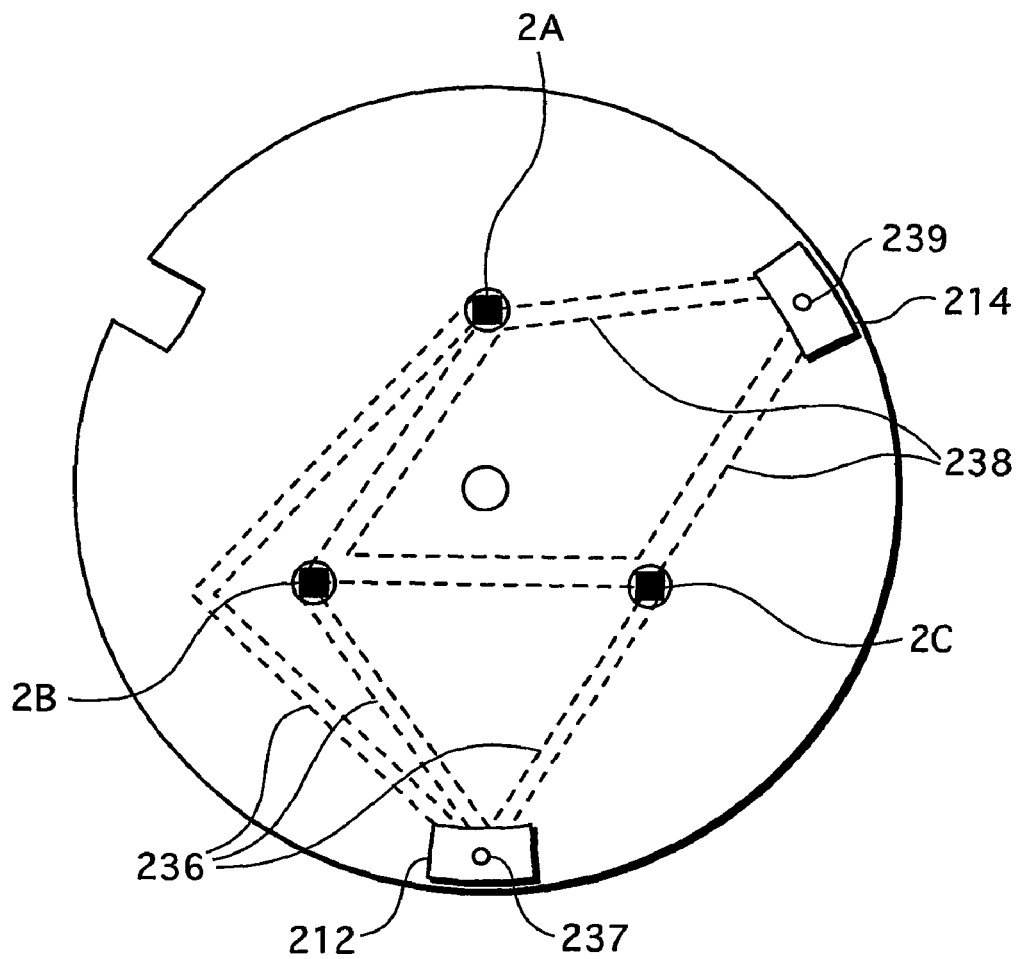
FIG. 25A illustrates the LED module after a lens is removed.
Figure 25B:
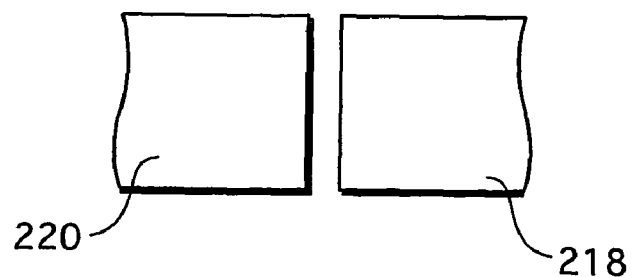
FIG. 25B illustrates a pad pattern formed on a ceramics substrate which is a constituent of the LED module.

FIG. 25A is a plan view illustrating the LED module 200 after the lenses 204, 206 and 208 are removed. In FIG. 25A, the three LED array chips 2 are distinguished from each other by addition of marks of A, B and C.

As described above, the anode pad 220 and the cathode pad 218 (FIG. 25B) are provided at the location, on the front surface of the ceramics substrate 201, where each of the LED array chips 2A, 2B and 2C is to be mounted.

The anode pads 220 that are respectively connected to the LED, array chips 2A, 2B and 2C are electrically connected to each other by a wiring pattern 236. The wiring pattern 236 is connected to the positive terminal 212 at its end by a plated-through hole 237. The cathode pads 218 that are respectively connected to the LED array chips 2A, 2B and 2C are electrically connected to each other by a wiring pattern 238. The wiring pattern 238 is connected to the negative terminal 214 at its end by a plated-through hole 239. In other words, the LED array chips 2A, 2B and 2C are connected in parallel by the wiring patterns 236 and 238.

The LED module 200 described above is attached to the lighting unit 240. The LED module 200 and the lighting unit 240 constitute a lighting apparatus 242.

Figure 26A:
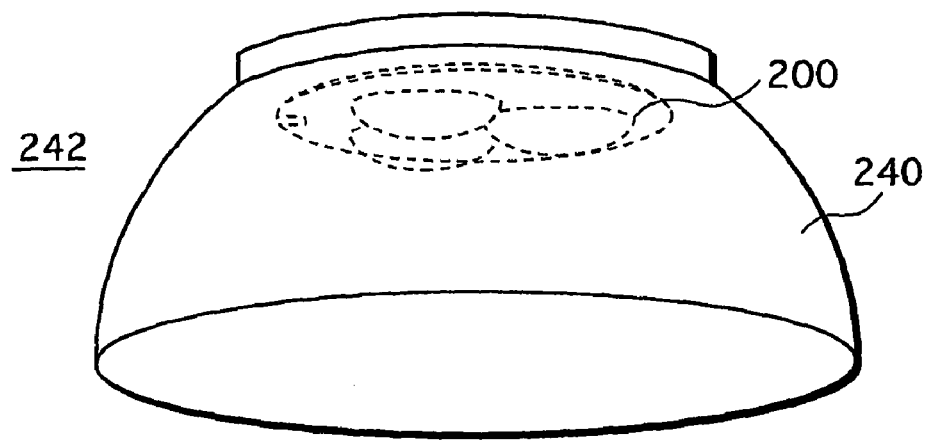
FIG. 26A is a perspective view illustrating a lighting apparatus.
Figure 26B:
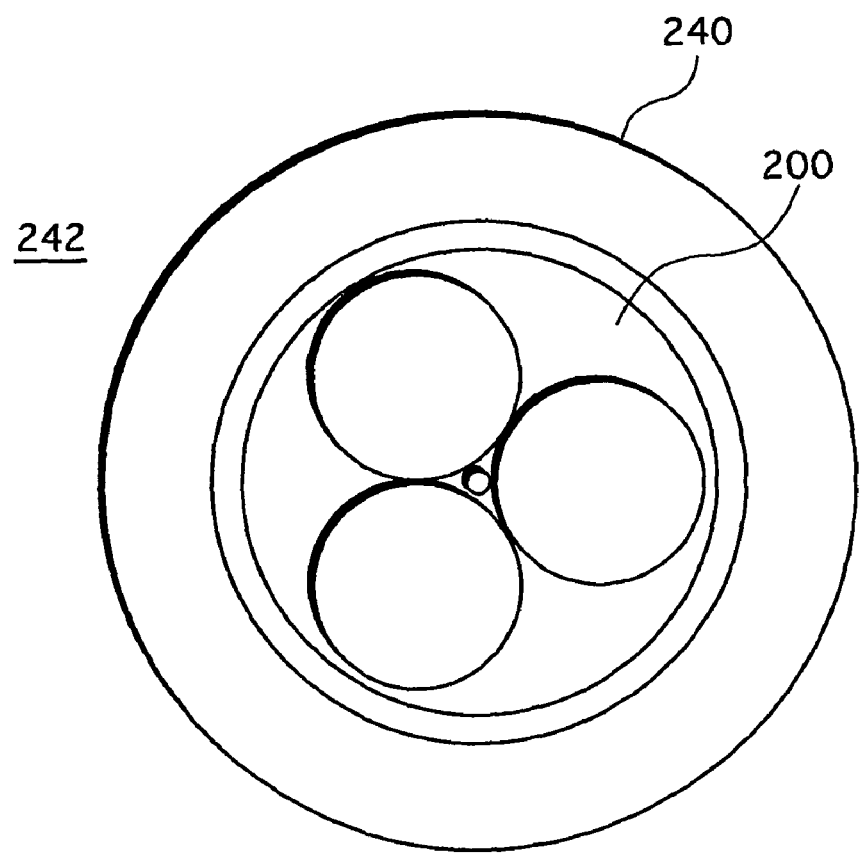
FIG. 26B is a bottom plan view illustrating the lighting apparatus.

FIG. 26A is a schematic perspective view illustrating the lighting apparatus 242, and FIG. 26B is a bottom plan view illustrating the lighting apparatus 242.

The lighting unit 240 is, for example, fixed on a ceiling of a room. The lighting unit 240 includes a power supply circuit (not shown in FIGS. 26A and 26B) that converts alternating-current power (e.g. 100 V, 50/60 Hz) supplied from a commercial power source into direct-current power required for driving the LED module 200.

Figure 27:
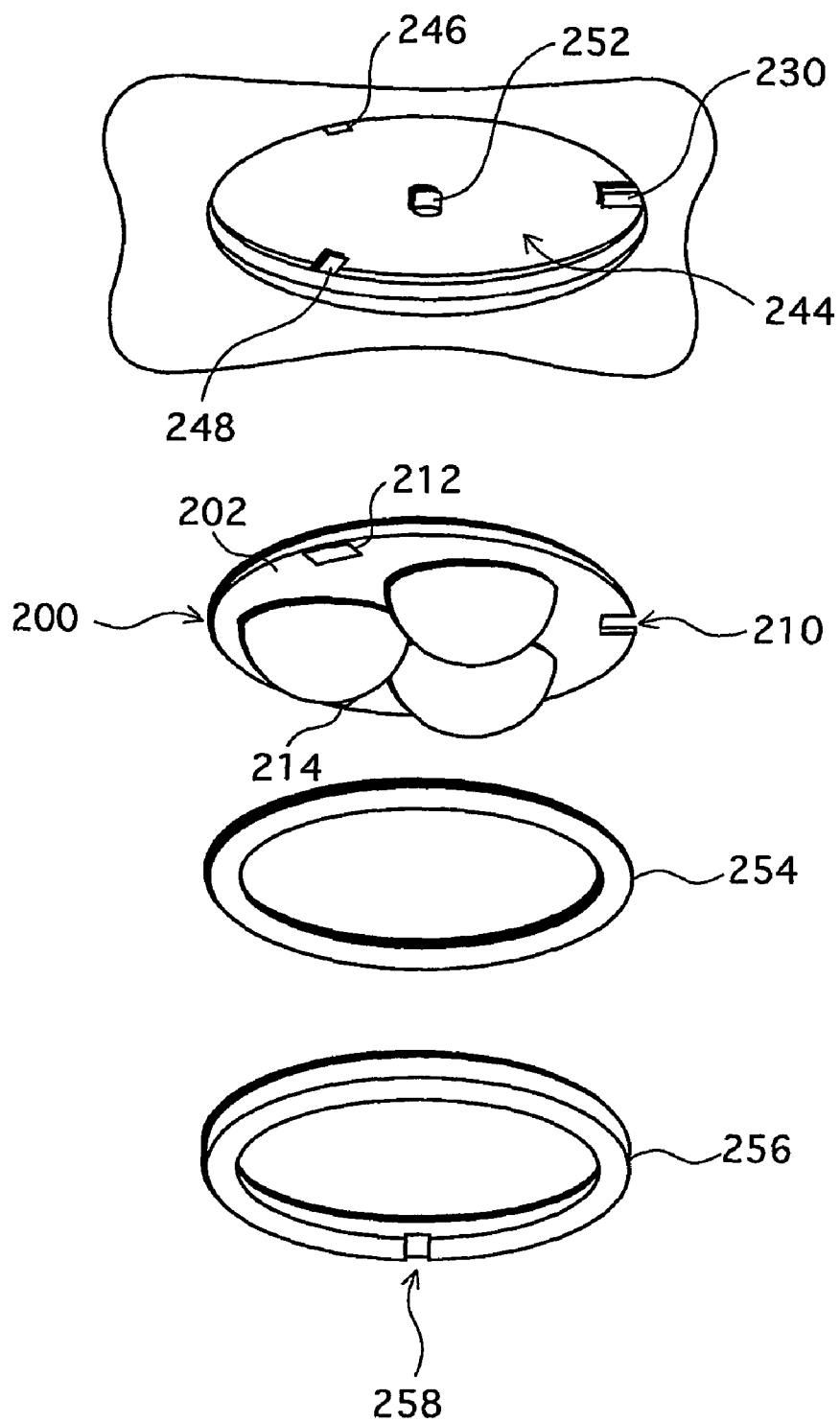
FIG. 27 is an exploded perspective view illustrating the lighting apparatus.

The following part describes a construction to attach the LED module 200 to the lighting unit 240, with reference to FIG. 27.

The lighting unit 240 has a circular depression 244 in which the LED module 200 is to be fitted. A bottom surface of the circular depression 244 is flat. An internal thread (not shown in FIG. 27) is created, in the vicinity of an open end of the circular depression 244, on an inside wall of the circular depression 244. Flexible power supply terminals 246 and 248 and a guiding protrusion 230 protrude from the inside wall of the circular depression 244, between the internal thread and the bottom surface of the circular depression 244. The power supply terminals 246 and 248 are respectively positive and negative. A guiding pin 252 is provided in the center of the bottom surface of the circular depression 244.

An O-ring 254 made of silicon rubber and a ring screw 256 are used to attach the LED module 200 to the lighting unit 240. The ring screw 256 has a shape of a ring that has a substantially rectangular cross-section. An external thread (not shown in FIG. 27) is created on an outer surface of the ring screw 256, and a depression 258 is provided in the ring screw 256.

The following part describes a procedure of attaching the LED module 200 to the lighting unit 240.

To start with, the LED module 200 is fitted in the circular depression 244 in the following manner. The ceramics substrate 202 of the LED module 200 is positioned between the bottom surface of the circular depression 244 and the power supply terminals 246 and 248. The guiding pin 252 is fitted in the guiding hole 216, so as to align the center of the LED module 200 with the center of the circular depression 244. Furthermore, the guiding protrusion 230 is fitted in the guiding depression 210, so as to align the positive and negative terminals 212 and 214 with the power supply terminals 246 and 248 respectively.

After the LED module 200 is fitted in the circular depression 244, the ring screw 256 to which the O-ring 254 has been attached is screwed into the circular depression 244 and fixed. Thus, the positive and negative terminals 212 and 214 are respectively connected to the power supply terminals 246 and 248, so that the terminals 212 and 214 are electrically connected to the terminals 246 and 248 reliably. In addition, the substantially entire back surface of the ceramics substrate 202 is connected to the flat bottom surface of the circular depression 244. This enables heat generated in the LED module 200 to be effectively conducted to the lighting unit 240, thereby improving a cooling effect of the LED module 200. Here, silicone grease may be applied to the back surface of the ceramics substrate 202 and the bottom surface of the circular depression 244 to further improve the heat conduction efficiency from the LED module 200 to the lighting unit 240.

When power is supplied to this lighting apparatus 242 from a commercial power source, the LEDs 6 in each LED array chip 2 emit blue light. Here, part of the blue light is converted into yellow light by the phosphor within the phosphor film 48. The blue light and the yellow light mix together, to generate white light. The white light is emitted through the lenses 204, 206 and 208.

Figure 28:
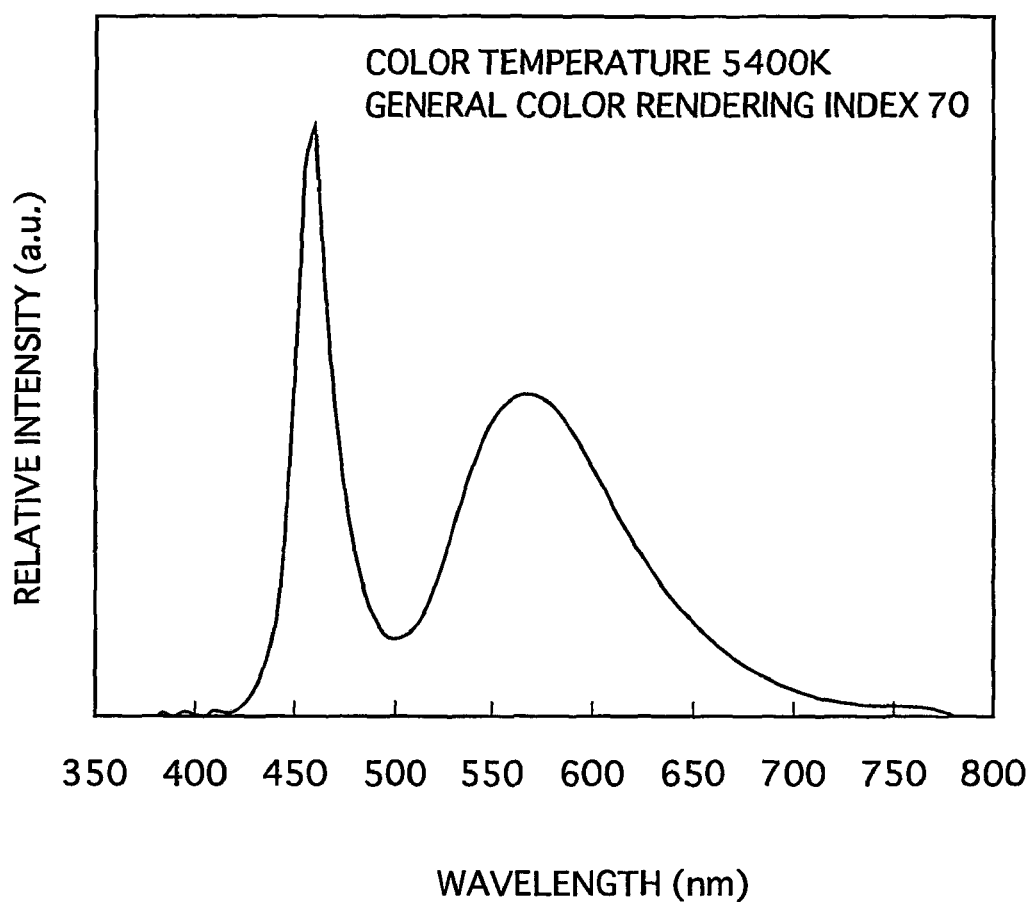
FIG. 28 illustrates an emission spectrum for the lighting apparatus.

When an electric current of 150 mA is applied to the LED module 200, a total luminous flux of 800 lm, an on-axis luminous intensity of 1500 cd, and an emission spectrum shown in FIG. 28 are observed.

Fifth Embodiment

According to the fourth embodiment, the semiconductor light emitting device relating to any of the first to third embodiments is used for lighting as an example, i.e. the lighting module 200 and the lighting apparatus 242. However, the semiconductor light emitting devices relating to the first to third embodiments may be also used for display, to be specific, as a light source in a display element. Such a display element includes a surface mounting device (SMD) LED which is formed in such a manner that a semiconductor light emitting device (e.g. an LED chip) is mounted on a ceramics substrate and sealed by a transparent epoxy resin.

Figure 29A:
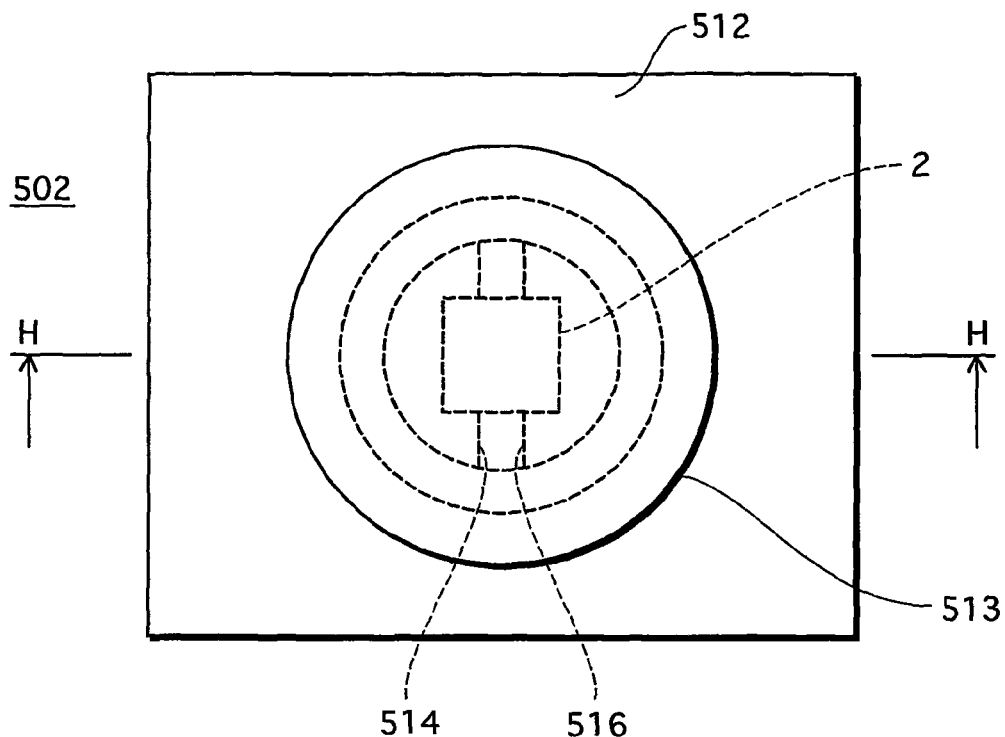
FIG. 29A is a plan view illustrating a surface mounting device (SMD) LED.
Figure 29B:
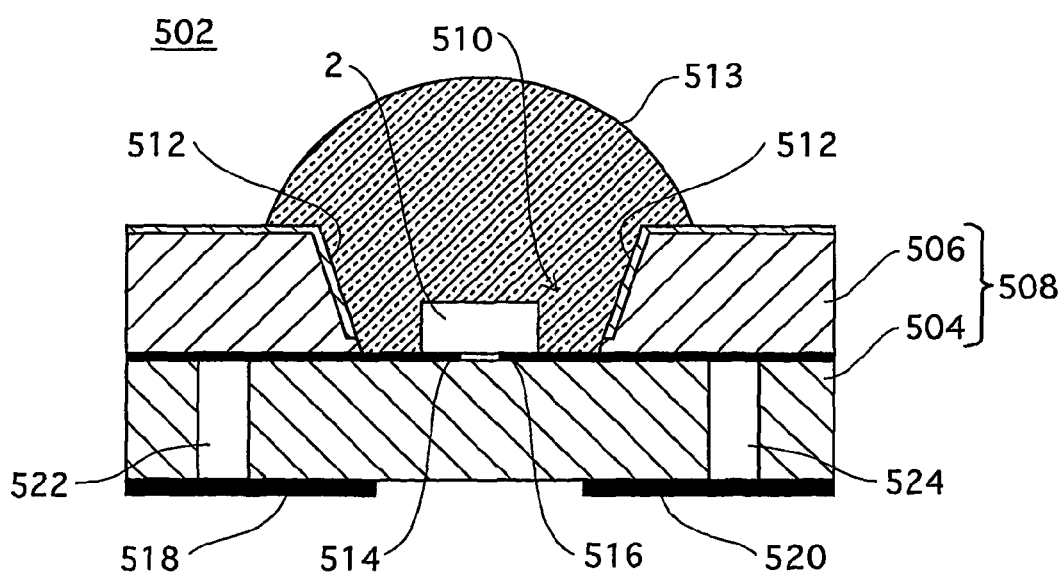
FIG. 29B illustrates a cross-section along a line HH shown in FIG. 29A.

FIG. 29A is a plan view illustrating an SMD LED 502 relating to a fifth embodiment (hereinafter simply referred to as an LED 502), and FIG. 29B illustrates a cross-section along a line HH shown in FIG. 29A.

The LED array chip 2 relating to the first embodiment (shown in FIGS. 3 to 5) is used as a light source of the LED 502. Instead of the LED array chip 2, the LED array chip 302 relating to the second embodiment, or the LED array chip 402 relating to the third embodiment may be used.

As shown in FIG. 29B, the LED 502 includes a ceramics substrate 508 made up of two ceramics substrates 504 and 506. A taper through hole 510 is provided in the upper ceramics substrate 506, so as to create a space for mounting the LED array chip 2. In other words, the ceramics substrate 508 has a depression which increases in diameter toward an open end. The LED array chip 2 is mounted on the bottom surface of the depression. Here, the depression in the ceramics substrate 508 may have a hemispherical shape, instead of a taper shape.

An aluminum reflective film 512 is formed at a substantially even thickness, on a slope (wall) of the through hole 510 provided in the upper ceramics substrate 506 and on a front surface of the ceramics substrate 506. Thus, a reflective mirror (hole) is formed. The through hole 510 is designed so that white light emitted from a side surface of the LED array chip 2 is reflected by the aluminum reflective film 512 on the wall of the through hole 510, in a direction substantially perpendicularly to a main surface of the ceramics substrate 506. The through hole 510 is filled with an epoxy resin, to form a lens 513, which has a role of sealing the LED array chip 2 airtight.

An anode pad 514 and a cathode pad 516 are formed on a front surface of the lower ceramics substrate 504. The power supply terminals 38 and 36 (shown in FIG. 5C) are respectively connected to the anode pad 514 and the cathode pad 516.

Terminals 518 and 520 of the LED 502 are provided on a back surface of the ceramics substrate 504. The terminal 518 is electrically connected to the anode pad 514 by a plated-through hole 522, and the terminal 520 is electrically connected to the cathode pad 516 by a plated-through hole 524.

When power is supplied to this LED 502 through the terminals 518 and 520, the LED array chip 2 emits white light through the lens 513.

Note that a single SMD LED may be used by itself. In this case, an SMD LED may be mounted on a remote controller for a home electric appliance such as a television, a video cassette recorder and an air conditioner, or used as a main switch lamp of such a home electric appliance. Alternatively, a plurality of SMD LEDs may be combined to be used, for example, as dots provided in a dot matrix display device for displaying a letter, a number, a symbol and the like.

The present invention is not limited to the above first to fifth embodiments, and includes the following modifications.

(1) According to the above embodiments, the exposed portion 7 is formed by removing a corresponding area of all of the layers composing the semiconductor multilayer structure (step C1 in FIG. 6). This may be modified as follows. When using the first embodiment as an example, the exposed portion 7 can be also formed by removing a corresponding area of layers from the outmost layer (the p-GaN contact layer 118) to the conductive layer between the light emitting layer 114 and the SiC substrate 104 (i.e. the n-GaN clad layer 112). In this way, the phosphor film 48 can be formed, at a sufficient thickness, not only on the outmost layer (the p-GaN contact layer 118), but also on a side surface, of the semiconductor multilayer structure, which is created by forming the exposed portion 7. This can reduce unevenness of color.

(2) According to the above embodiments, the semiconductor multilayer structure composed of layers from the n-AlGaN buffer layer (8) to the p-GaN contact layer (18 and 318) is epitaxially grown on the SiC substrate (4, 304 and 404). Having a higher heat conductivity than copper or aluminum, the SiC substrate (4, 304 and 404) can efficiently dissipate heat generated in the light emitting layer (14) to the ceramics substrate (202 and 508), which is a printed wiring board, and on which the LED array chip (2, 302 and 402) is mounted. Here, the SiC substrate (4, 304 and 404) may be replaced with any of an AlN substrate, a GaN substrate, a BN substrate, an Si substrate, and a diamond substrate, all of which similarly have a high heat conductivity.

Alternatively, the SiC substrate (4, 304 and 404) may be replaced with a widely-used sapphire substrate, which has a slightly lower heat conductivity.

(3) According to the above embodiments, the LED array chip (2, 302 and 402) includes 35 LEDs (light emitting elements), and is a square substantially 2 mm a side. However, the number of LEDs (light emitting elements) in the LED array chip (2, 302 and 402), and the size of the LED array chip (2, 302 and 402) are not limited to such.

Instead of an LED array chip, an LED chip composed of one LED (light emitting element) may be used to realize the present invention. If such is the case, the exposed portion 7 is formed so as to surround each LED in the step C1 of FIG. 6 in the first embodiment, for example. Furthermore, two power supply terminals are formed on the back surface of the SiC substrate 104 for each LED, and two plated-through holes are formed in the SiC substrate 104 for each LED.

(4) According to the above embodiments, the phosphor film 48 is made of a silicone resin in which particles of a phosphor are dispersed. Instead of a silicone resin, glass with a low melting point may be used. Alternatively, glass including particles of a phosphor which has been generated using the sol-gel process. Here, generally speaking, glass is more durable against heat or ultraviolet rays than a resin. For this reason, an LED (array) chip including a phosphor film made of glass is able to produce an increasingly higher output in accordance with future technology development, and can have a higher heat resistance against a high-temperature process in mounting the LED (array) chip.

(5) According to the fourth embodiment, the lighting module 200 includes one of the white LED array chips 2, 302 and 402. Other than these white LED array chips 2, 302 and 402, a white LED chip including a silicon sub-mounting substrate disclosed in Japanese Patent No. 3399440 can be used. In this white LED chip, an LED bare chip is smaller than the silicon sub-mounting substrate, and a wire bonding pad needs to be formed on a mounting substrate. Therefore, a diameter of a reflective hole needs to be increased, which may result in a slightly lower light collection efficiency, and a slightly lower packaging density. Despite these drawbacks, however, this white LED chip can be used since the white LED chip can be mounted on a printed wiring board with a reflective film.

(6) According to the above embodiments, a semiconductor multilayer structure constituting an LED is epitaxially grown on an SiC substrate which is a constituent of an LED array chip (a semiconductor light emitting device).

However, the above embodiments are not limited to such. The semiconductor multilayer structure may be first epitaxially grown on a single-crystal substrate (e.g. a sapphire substrate) which is different from the SiC substrate, and then transferred to the SiC substrate.

In other words, the SiC substrate which is a base substrate constituting the LED array chip (a semiconductor light emitting device) may or may not be a substrate on which the semiconductor multilayer structure is epitaxially grown.

INDUSTRIAL APPLICABILITY

As described above, the present invention provides a semiconductor light emitting device which can be favorably used for a lighting apparatus and the like.

The invention claimed is:
1. A semiconductor light emitting device comprising:
a substrate;
a semiconductor multilayer structure formed on one of a plurality of main surfaces of the substrate, the semiconductor multilayer structure including a light emitting layer;
a first electrode and a second electrode formed on the semiconductor multilayer structure, power being supplied to the semiconductor multilayer structure through the first electrode and the second electrode causing the light emitting layer to emit light; and
a phosphor film covering at least an entire main surface of the semiconductor multilayer structure which faces away from the substrate, wherein
the semiconductor multilayer structure is divided into a plurality of portions by a division groove, and each of the plurality of portions is an independent light emitting element,
each of a plurality of light emitting elements have a diode structure, and includes an anode electrode and a cathode electrode, and an insulating film is formed on a side surface of each of the plurality of light emitting elements,
the plurality of light emitting elements are connected in series such that a cathode electrode of a light emitting element is connected to an anode electrode of a different light emitting element using a wire formed by a thin metal film formed on the insulating film, and
one of an anode electrode of one of the plurality of light emitting elements at a higher potential end of an array of the plurality of light emitting elements is the first electrode, and one of a cathode electrode of one of the plurality of light emitting elements at a lower potential end of the array of the plurality of light emitting elements is the second electrode.

2. The semiconductor light emitting device of claim 1, wherein
the semiconductor multilayer structure includes a light reflective layer between the light emitting layer and the one of the plurality of main surface of the substrate.

3. The semiconductor light emitting device of claim 1, wherein
the division groove is deep enough to reach the substrate.

4. The semiconductor light emitting device of claim 1 further comprising:
a first terminal and a second terminal formed on another one of the plurality of main surfaces of the substrate;
a first conductive member electrically connecting the first electrode to the first terminal; and
a second conductive member electrically connecting the second electrode to the second terminal.

5. The semiconductor light emitting device of claim 4, wherein
at least a part of each of the first conductive member and the second conductive member is a plated-through hole provided in the substrate.

6. The semiconductor light emitting device of claim 5, wherein each of the plated-through holes is located at a different corner of the substrate.

7. The semiconductor light emitting device of claim 6, wherein
the plurality of light emitting elements are formed on locations aside from locations of the plated-through holes.

8. The semiconductor light emitting device of claim 4, wherein
at least part of each of the first conductive member and the second conductive member is a conductive film formed on a side surface of the substrate.

9. The semiconductor light emitting device of claim 1, wherein
the substrate is highly resistant.

10. The semiconductor light emitting device of claim 1, wherein
the semiconductor multilayer structure has a structure of epitaxial growth on the substrate.

11. The semiconductor light emitting device of claim 1, wherein
the semiconductor multilayer structure is a semiconductor multilayer structure that has been epitaxially grown on a single-crystal substrate different from the substrate and transferred to the substrate.

12. The semiconductor light emitting device of claim 1 wherein the anode electrode for each of the plurality of light emitting elements includes a transparent electrode.

13. The semiconductor light emitting device of claim 2 wherein the light reflective layer is a distributed Bragg reflector layer.

14. A lighting module comprising:
a mounting substrate; and
a semiconductor light emitting device defined in claim 1 mounted on the mounting substrate.

15. The lighting module of claim 14, wherein
The mounting substrate has a depression which includes a reflective film on a wall thereof, and
The semiconductor light emitting device is mounted on a bottom of the depression.

16. A manufacturing method for a semiconductor light emitting device, comprising the steps of:
forming a semiconductor multilayer structure including a light emitting layer on one of a plurality of main surfaces of a substrate;
dividing the semiconductor multilayer structure into a plurality of portions each of which corresponds to a semiconductor light emitting device;
forming a phosphor film on and around each of the plurality of portions of the semiconductor multilayer structure;
dividing the substrate for each of the plurality of portions of the semiconductor multilayer structure; and
connecting the plurality of portions of the semiconductor multilayer structure in series using a thin metal wire.

17. The method of claim 16 further comprising the step of:
varying a percentage of phosphor in the phosphor film to vary a color temperature of a white light emitted by the semiconductor light emitting device.

18. The method of claim 16 further comprising the step of:
varying a thickness of the phosphor film to vary a color temperature of a white light emitted by the semiconductor light emitting device.

19. An array of a plurality of light emitting elements formed on a substrate, wherein
the light emitting elements are covered with a phosphor layer,
a first light emitting element included in the light emitting elements is formed by laminating a first conductive layer to which a first electrode is connected, a light emitting layer, and a second conductive layer to which a second electrode is connected, on the substrate in this order,
a second light emitting element included in the light emitting elements is formed by laminating a first conductive layer to which a first electrode is connected, a light emitting layer, and a second conductive layer to which a second electrode is connected, on the substrate in this order, the second light emitting element being adjacent to the first light emitting element,
the first electrode included in the first light emitting element is electrically connected to the second electrode included in the second light emitting element by a metal film, and
the first and the second light emitting elements are separated from each other by a groove.

20. The array of claim 19 further comprising an insulating film formed on a side surface of the first light emitting element and a side surface of the second light emitting element, wherein the entire metal film is formed above the insulating film.

21. The array of claim 19 wherein
the first light emitting element includes a first light reflective layer located between the light emitting layer of the first light emitting element and the substrate, and
the second light emitting element includes a second light reflective layer located between the light emitting layer of the second light emitting element and the substrate.

22. The array of claim 21 wherein
the first light reflective layer is a first distributed Bragg reflector layer, and
the second light reflective layer is a second distributed Bragg reflector layer.

23. The array of claim 19 wherein the groove is deep enough to reach the substrate.

24. The array of claim 19 further comprising
a first terminal formed on the substrate;
a second terminal formed on the substrate;
a first conductive member electrically connecting the first electrode in the first light emitting element to the first terminal; and
a second conductive member electrically connecting the second electrode in the second light emitting element to the second terminal.

25. The array of claim 24 wherein at least part of each of the first conductive member and the second conductive member is a plated-through hole provided in the substrate.

26. The array of claim 25 wherein each of the plated-through holes is located at a different corner of the substrate.

27. The array of claim 26 wherein the first light emitting element and the second light emitting element are formed on locations aside from the locations of the plated-through holes.

28. The array of claim 24 wherein at least part of each of the first conductive member and the second conductive member is a conductive film formed on a side surface of the substrate.

29. The array of claim 19 wherein the substrate is highly resistant.

30. The array of claim 19 wherein
the first light emitting element includes a first semiconductor multilayer structure having a structure of epitaxial growth on the substrate, and
the second light emitting element has second semiconductor multilayer having a structure of epitaxial growth on the substrate.

31. The array of claim 19 wherein
the first light emitting element includes a first semiconductor multilayer structure on the substrate, the first semiconductor multilayer structure being epitaxially grown on a single-crystal substrate different from the substrate and transferred to the substrate, and
the second light emitting element includes a second semiconductor multilayer structure on the substrate, the second semiconductor multilayer structure being epitaxially grown on a single-crystal substrate different from the substrate and transferred to the substrate.

32. The array of claim 19 wherein
the second electrode in the first light emitting element includes a first transparent electrode, and
the second electrode in the second light emitting element includes a second transparent electrode.

33. A semiconductor light emitting device comprising:
a substrate;
a plurality of light emitting elements connected in series formed on the substrate and separated by division grooves, the plurality of light elements including only one external cathode electrode and only one external anode electrode, each of the plurality of light emitting elements including
a first electrode located above the substrate,
a light reflecting layer located above the substrate,
a light emitting layer located above the light reflecting layer, and
a second electrode located above the light emitting layer,
wherein, a first electrode of a first light emitting element at a lower potential end of the plurality of lighting elements is the one external cathode electrode, and a second electrode of a second light emitting element at a higher potential end of the plurality of lighting elements is the one external anode electrode; and
a phosphorus layer covering all of the substrate and the plurality of light emitting elements.

\* \* \* \* \*